US012150237B2

(12) United States Patent
Migliorino et al.

(10) Patent No.: US 12,150,237 B2
(45) Date of Patent: Nov. 19, 2024

(54) METHOD AND PROCEDURE FOR MINIATURING A MULTI-LAYER PCB

(71) Applicant: Veea Inc., New York, NY (US)

(72) Inventors: Robert Migliorino, Wayne, NJ (US); Michael Mirabella, Lanoka Harbor, NJ (US); Clint Smith, Warwick, NY (US)

(73) Assignee: VEEA Inc., New York, NY (US)

( * ) Notice: Subject to any disclaimer, the term of this patent is extended or adjusted under 35 U.S.C. 154(b) by 227 days.

(21) Appl. No.: 18/053,264

(22) Filed: Nov. 7, 2022

(65) Prior Publication Data
US 2023/0087792 A1 Mar. 23, 2023

Related U.S. Application Data

(63) Continuation-in-part of application No. 17/313,073, filed on May 6, 2021, now Pat. No. 11,523,502.

(60) Provisional application No. 63/020,745, filed on May 6, 2020.

(51) Int. Cl.
H05K 1/02 (2006.01)
H05K 1/11 (2006.01)

(52) U.S. Cl.
CPC ......... H05K 1/0206 (2013.01); H05K 1/0218 (2013.01); H05K 1/115 (2013.01); H05K 2201/066 (2013.01); H05K 2201/09609 (2013.01); H05K 2201/09854 (2013.01)

(58) Field of Classification Search
CPC .... H05K 1/0206; H05K 1/0218; H05K 1/115; H05K 2201/066; H05K 2201/09609; H05K 2201/09854; H05K 1/0298; H05K 1/0231; H05K 1/0242
See application file for complete search history.

(56) References Cited

U.S. PATENT DOCUMENTS

| 5,475,606 A | 12/1995 | Muyshondt et al. |
| 5,964,854 A | 10/1999 | Roozenbeek et al. |
| 6,844,505 B1 | 1/2005 | Fan et al. |
| 7,692,101 B2 | 4/2010 | Duong |

(Continued)

OTHER PUBLICATIONS

USPTO, U.S. Appl. No. 17/946,450, Non-Final Office Action dated Feb. 1, 2023, 15 pages.

(Continued)

Primary Examiner — Hoa C Nguyen
(74) Attorney, Agent, or Firm — The Marbury Law Group, PLLC

(57) ABSTRACT

A multiple layer printed circuit board including a plurality of layers, vertical interconnect accesses (VIAs), and a vertical interconnect access (VIA) bridge. The layers may include signal layers, prepreg substrate layers disposed between the signal layers, ground plane layers, wherein each of the ground plane layers abuts one of the prepreg substrate layers, inner signal layers, wherein each of the inner signal layers abuts one of the prepreg substrate layers, and a core substrate layer disposed between the signal layers, wherein two of the inner signal layers abut opposed sides of the core substrate layer. The VIAs extend through at least some of the layers, wherein each of the VIAs is formed by aligned apertures through adjoining ones of the prepreg substrate layers, ground plane layers, and inner signal layers. The VIA bridge is coupled to the VIAs to convey heat to a heat sink.

20 Claims, 26 Drawing Sheets

(56) References Cited

U.S. PATENT DOCUMENTS

| | | | |
|---|---|---|---|
| 7,728,428 | B2 | 6/2010 | Lim |
| 8,716,898 | B1 | 5/2014 | Liu et al. |
| 9,036,364 | B1 | 5/2015 | Fung |
| 2005/0225955 | A1 | 10/2005 | Grebenkemper et al. |
| 2007/0030626 | A1 | 2/2007 | Barnett |
| 2009/0140400 | A1 | 6/2009 | Amey, Jr. et al. |
| 2009/0323300 | A1 | 12/2009 | Fujimoto et al. |
| 2010/0101850 | A1 | 4/2010 | Chou |
| 2010/0230145 | A1 | 9/2010 | Holcomb |
| 2014/0126156 | A1* | 5/2014 | Naganuma ........... H05K 1/0233 361/720 |
| 2014/0027165 | A1 | 6/2014 | Morita et al. |
| 2014/0204546 | A1 | 7/2014 | Baker |
| 2015/0136447 | A1 | 5/2015 | Katou et al. |
| 2015/0181698 | A1* | 6/2015 | Suganuma ........ H01L 27/14636 174/254 |
| 2016/0049723 | A1* | 2/2016 | Baks ................... H01Q 9/0457 343/848 |
| 2017/0213821 | A1* | 7/2017 | Or-Bach .................. G11C 5/02 |
| 2018/0159203 | A1* | 6/2018 | Baks ...................... H01Q 9/045 |
| 2019/0237461 | A1* | 8/2019 | Or-Bach ............... H10B 41/20 |
| 2021/0068261 | A1* | 3/2021 | Cho ..................... H05K 1/0298 |

OTHER PUBLICATIONS

USPTO, U.S. Appl. No. 17/946,450, Final Office Action dated Jun. 29, 2023, 10 pages.
USPTO, U.S. Appl. No. 17/946,450, Application as Filed on Sep. 16, 2022, 62 pages.
USPTO, U.S. Appl. No. 17/313,073, Application as Filed on May 6, 2021, 61 pages.

* cited by examiner

8 Layer MultiLayer PCB

| # | | |
|---|---|---|
| 102 | Metal (Signals/PowerTraces + Shapes) | 1 |
| 104 | Prepreg | |
| 106 | Metal (Signals/PowerTraces + Shapes + GND) | 2 |
| 108 | Core | |
| 110 | Metal (Signals/PowerTraces + Shapes) | 3 |
| 112 | Prepreg | |
| 114 | Metal (Signals/PowerTraces + Shapes + GND) | 4 |
| 116 | Core | |
| 118 | Metal (Signals/PowerTraces + Shapes) | 5 |
| 120 | Prepreg | |
| 122 | Metal (Signals/PowerTraces + Shapes + GND) | 6 |
| 124 | Core | |
| 126 | Metal (Signals/PowerTraces + Shapes) | 7 |
| 128 | Prepreg | |
| 130 | Metal (Signals/PowerTraces + Shapes + GND) | 8 |

FIG. 1

12 Layer MultiLayer PCB

200

| # | Ref | Layer | Layer # |
|---|---|---|---|
| 202 | Metal (Signals/PowerTraces + Shapes) | 1 |
| 204 | Prepreg | |
| 206 | Metal (Signals/PowerTraces + Shapes + GND) | 2 |
| 208 | Core | |
| 210 | Metal (Signals/PowerTraces + Shapes) | 3 |
| 212 | Prepreg | |
| 214 | Metal (Signals/PowerTraces + Shapes + GND) | 4 |
| 216 | Core | |
| 218 | Metal (Signals/PowerTraces + Shapes) | 5 |
| 220 | Prepreg | |
| 222 | Metal (Signals/PowerTraces + Shapes + GND) | 6 |
| 224 | Core | |
| 226 | Metal (Signals/PowerTraces + Shapes) | 7 |
| 228 | Prepreg | |
| 230 | Metal (Signals/PowerTraces + Shapes + GND) | 8 |
| 232 | Core | |
| 234 | Metal (Signals/PowerTraces + Shapes) | 9 |
| 236 | Prepreg | |
| 238 | Metal (Signals/PowerTraces + Shapes + GND) | 10 |
| 240 | Core | |
| 242 | Metal (Signals/PowerTraces + Shapes) | 11 |
| 244 | Prepreg | |
| 246 | Metal (Signals/PowerTraces + Shapes + GND) | 12 |

FIG. 2

METHOD AND PROCEDURE FOR MINIATURING A MULTI-LAYER PCB

RELATED APPLICATIONS

This application is a continuation-in-part and claims the benefit of priority to U.S. Non-Provisional patent application Ser. No. 17/313,073, entitled "Method and Procedure for Miniaturing a Multi-layer PCB," filed May 6, 2021, and also claims the benefit of priority to U.S. Provisional Patent Application No. 63/020,745, entitled "Method and Procedure for Miniaturing a Multi-layer PCB," filed May 6, 2020, the entire contents of both are hereby incorporated by reference for all purposes.

BACKGROUND

Printed circuit boards (PCBs) are the core of most electronics today, and one of the most important components in an electrical system not shown on schematics. PCBs are electrical systems with electrical properties and have discrete components and devices mounted to them. Generally, PCBs are made up of an insulator substrate material that has metal plating on one or both sides, typically copper. The PCB may also have portions of metal (typically copper) that is etched away to form conductive paths or to assist in mounting devices.

A PCB may be a single or multiple layer board design. Multi-layer PCBs include plated and etched substrates that are glued together in a stack with additional insulator substrates between the etched substrates. Holes may be drilled through the multilayer stack, and conductive plating may be applied to the holes to form conductive connections between the different layers of the etched copper.

Multi-layer PCBs are more complex than single layer PCB boards but have many added advantages such as performance improvements like noise, stray capacitance, and cross talk. Multi-layer PCBs also enable miniaturization of electronics.

SUMMARY

The various aspects include a multi-layer printed circuit board (PCB) that includes a plurality of layers, including a plurality of signal layers, a plurality of ground plane layers, a plurality of inner signal layers, and a single core substrate layer, and in which each layer in the plurality of layers is separated from the other layers in the plurality of layers by at least one prepreg substrate layer. In some aspects, the prepreg substrates may provide the overall structural integrity of the multi-layer PCB. In some aspects, the first, second, third and fourth ground plane layers may be connected via one or more leads to provide a shared common ground for both analog and digital signals.

In some aspects, the multi-layer PCB may include a single decoupling capacitor per N finite element method (FEM) components. In some aspects, the multi-layer PCB may include one ferrite bead per N finite element method (FEM) components. In some aspects, the multi-layer PCB may include multi-layer PCB includes a single power distribution network (PDN).

The various aspects may also include a multi-layer PCB that includes a first signals layer, a first prepreg substrate abutting the first signals layer, a first ground plane layer abutting the first prepreg substrate, a second prepreg substrate abutting the first ground plane layer, a first inner signal layer abutting the second prepreg substrate, a third prepreg substrate abutting the first inner signal layer, a second inner signal layer abutting the third prepreg substrate, a fourth prepreg substrate abutting the second inner signal layer, a second ground plane layer abutting the fourth prepreg substrate, a fifth prepreg substrate abutting the second ground plane layer, a third inner signal layer abutting the fifth prepreg substrate, a core substrate abutting the third inner signal layer, a fourth inner signal layer abutting the core substrate, a sixth prepreg substrate abutting the fourth inner signal layer, a third ground plane layer abutting the sixth prepreg substrate, a seventh prepreg substrate abutting the third ground plane layer, a fifth inner signal layer abutting the seventh prepreg substrate, an eighth prepreg substrate abutting the fifth inner signal layer, a sixth inner signal layer abutting the eighth prepreg substrate, a ninth prepreg substrate abutting the sixth inner signal layer, a fourth ground plane layer abutting the ninth prepreg substrate, a tenth prepreg substrate abutting the fourth ground plane layer, and a second signals layer abutting the tenth prepreg substrate.

Further aspects may include a multi-layer printed circuit board (PCB) including a plurality of layers, one or more vertical interconnect accesses (VIAs), and a vertical interconnect access (VIA) bridge. Thea plurality of layers may include a pair of signal layers, a plurality of prepreg substrate layers disposed between the pair of signal layers, a plurality of ground plane layers, wherein each of the plurality of ground plane layers abuts one of the plurality of prepreg substrate layers, a plurality of inner signal layers, wherein each of the plurality of the inner signal layers abuts one of the plurality of prepreg substrate layers, and a core substrate layer disposed between the pair of signal layers, wherein two of the plurality of inner signal layers abut opposed sides of the core substrate layer. The VIAs may extend through at least some of the plurality of layers. Each of the one or more VIAs may be formed by aligned apertures through adjoining ones of at least one of the plurality of prepreg substrate layers, at least one of the plurality of ground plane layers, and at least one of the plurality of inner signal layers. The VIA bridge may be formed of conductive material and coupled to at least one of the one or more VIAs to convey heat from the at least one of the one or more VIAs to a heat sink.

In various embodiments, at least one of the one or more VIAs may be a convection passage, wherein each convection passage may be configured to promote heat transfer via convection through at least some of the plurality of layers. At least one of the one or more VIAs may be a conductive passage, wherein each conductive passage contains an electrically conductive material therein extending through at least some of the plurality of layers. The electrically conductive material, in at least one of the one or more VIAs, may include a hollow passage extending vertically within the electrically conductive material and may be configured to promote heat transfer via convection through the hollow passage of the electrically conductive material. The electrically conductive material, in at least one of the one or more VIAs, may fill at least one of the aligned apertures. The electrically conductive material, in at least one of the one or more VIAs, may fill only a partial vertical extent of the at least one of the one or more VIAs.

In some embodiments, the one or more VIAs may include a plurality of VIAs spaced around a perimeter of an inner area of the plurality of layers. The plurality of VIAs may be arranged in two rows spaced around the perimeter of the inner area, wherein an outer row of the plurality of VIAs may be closer to the perimeter of the inner area than an inner row of the plurality of VIAs. A spacing of the outer row of the plurality of VIAs may be offset from a spacing of the inner row of the plurality of VIAs, such that each of the plurality of VIAs in the inner row may be aligned between two adjacent ones of the plurality of VIAs in the outer row.

In some embodiments, two or more term pads disposed at opposed vertical ends of the one or more VIAs. The VIA bridge may couple the two or more term pads and may be configured to convey heat from the two or more term pads to the same heat sink. Each of the two or more term pads may be associated with a separate set of the one or more VIAs. The VIA bridge may couple to only a portion of an outer surface of at least one of the two or more term pads. At least one of the two or more term pads may include a first section with the conductive material and a second section with non-conductive material. A first surface of the VIA bridge may be coupled to the heat sink includes a larger surface area than a second surface of the VIA bridge coupled to the two or more term pads.

In some embodiments, the VIA bridge may include a clad plating on surfaces other than a surface coupling the VIA bridge to the heat sink. The VIA bridge may couple at least one of the one or more VIAs to an integrated circuit. The one or more VIAs may include a first set of passages and a second set of passages, wherein the first set of passages extends through a different set of layers of the plurality of layers than the second set of passages. The one or more VIAs may include a first set of passages and a second set of passages, wherein the first set of passages are spaced away from the second set of passages more than the first set of passages are spaced apart from one another.

Further aspects may include a computing device (e.g., an edge computing device, etc.) that includes the multi-layer PCBs discussed above.

BRIEF DESCRIPTION OF THE DRAWINGS

The accompanying drawings, which are incorporated herein and constitute part of this specification, illustrate exemplary embodiments of the invention. Together with the general description given above and the detailed description given below, the drawings serve to explain features of the invention.

FIG. 1 is a component block diagram that illustrates an 8-layer PCB configured in accordance with some embodiments.

FIG. 2 is a component block diagram that illustrates a 12-layer PCB configured in accordance with some embodiments.

DETAILED DESCRIPTION

Figure 3:
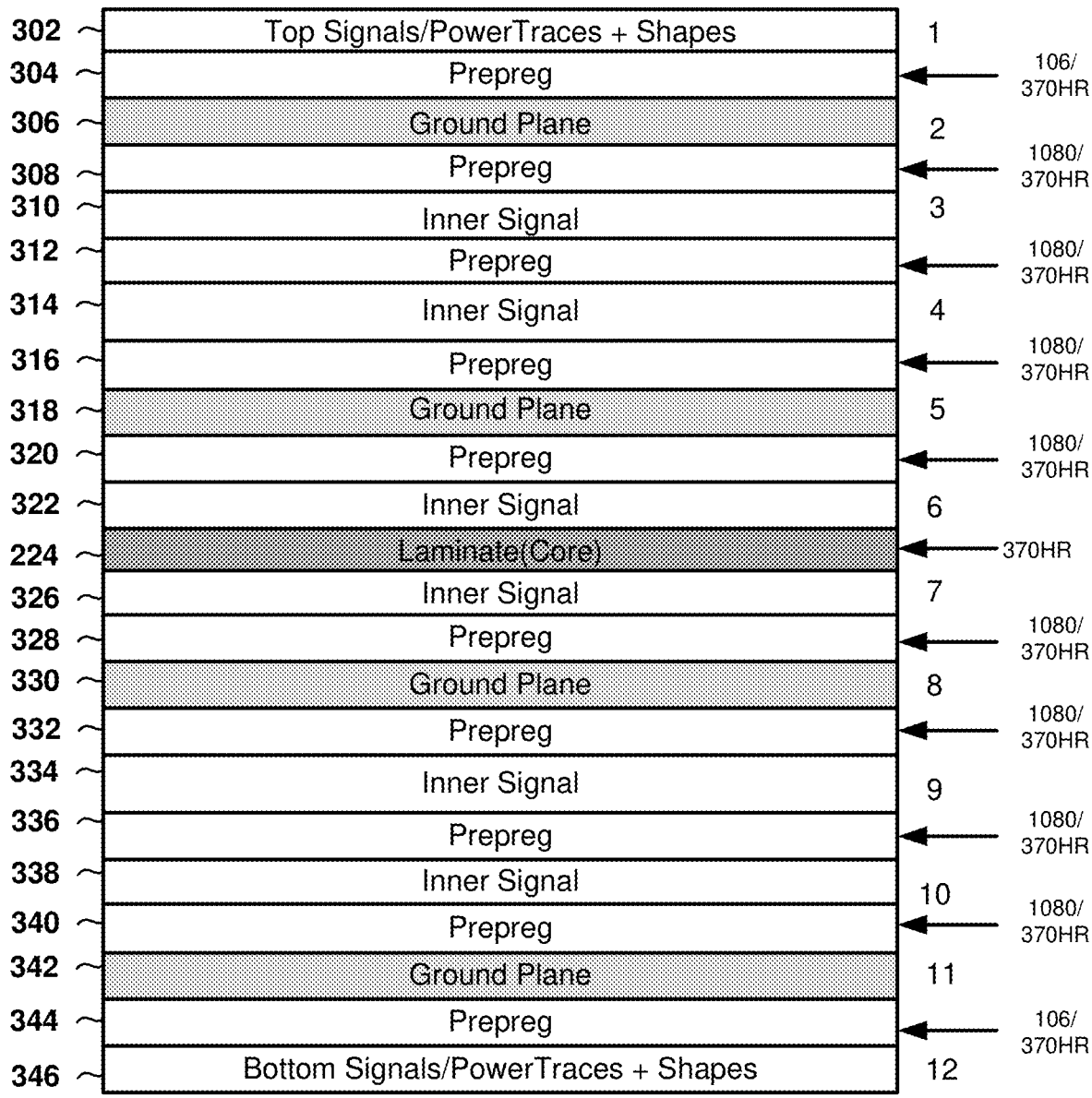
FIG. 3 is a component block diagram that illustrates a 12-layer PCB having a single core that may be configured in accordance with some embodiments.

The various embodiments will be described in detail with reference to the accompanying drawings. Wherever possible, the same reference numbers will be used throughout the drawings to refer to the same or like parts. References made to particular examples and implementations are for illustrative purposes and are not intended to limit the scope of the invention or the claims.

The word "exemplary" is used herein to mean "serving as an example, instance, or illustration." Any implementation described herein as "exemplary" is not necessarily to be construed as preferred or advantageous over other implementations.

In overview, the various embodiments include a multiple layer PCB in which the cores (or core layers) are removed and replaced with prepreg layers that provide structure integrity for the PCB. For example, some embodiments include multi-layer PCB that includes a plurality of layers that include a plurality of signal layers, a plurality of ground plane layers, a plurality of inner signal layers, and a single core substrate layer. Each layer in the plurality of layers may be separated from every other layer in the plurality of layers by at least one prepreg substrate layer. This organization (e.g., replacement of core layers with prepreg substrate layers) may increase the densification of the multi-layer PCB, reduce the overall stack height of the multi-layer PCB, and/or improve its power efficiency (e.g., through better impedance matching). Increasing the densification of the multi-layer PCB improves the performance of the multi-layer PCB and reducing the overall stack height reduces the thickness of the multi-layer PCB (i.e., by removing the need for having multiple core layers, etc.).

The embodiments also include a power distribution network (PDN) that includes a single power distribution system (instead of multiple). The PDN may include a reduced number of ferrite beads, which may improve power efficiency through reduced impedance loss. The PDN may also include a reduced number of decoupling caps, for better impendence matching and improved transient power delivery.

The embodiments also include a shared grounding system that includes common analog and digital grounds, which improves noise and power distribution, reduces decoupling caps with equivalent for better impendence matching, and separates grounds from signal traces to improve circuit/PCB density.

A number of different cellular and mobile communication services and standards are available or contemplated in the future, all of which may implement and benefit from the various embodiments. Such services and standards include, e.g., third generation partnership project (3GPP), long term evolution (LTE) systems, third generation wireless mobile communication technology (3G), fourth generation wireless mobile communication technology (4G), fifth generation wireless mobile communication technology, global system for mobile communications (GSM), universal mobile telecommunications system (UMTS), 3GSM, general packet radio service (GPRS), code division multiple access (CDMA) systems (e.g., cdmaOne, CDMA2000™), enhanced data rates for GSM evolution (EDGE), advanced mobile phone system (AMPS), digital AMPS (IS-136/TDMA), evolution-data optimized (EV-DO), digital enhanced cordless telecommunications (DECT), Worldwide Interoperability for Microwave Access (WiMAX), wireless local area network (WLAN), public switched telephone network (PSTN), Wi-Fi Protected Access I & II (WPA, WPA2), Bluetooth®, integrated digital enhanced network (iden), and land mobile radio (LMR). Each of these technologies involves, for example, the transmission and reception of voice, data, signaling and/or content messages. It should be understood that any references to terminology and/or technical details related to an individual telecommunication standard or technology are for illustrative purposes only and are not intended to limit the scope of the claims to a particular communication system or technology unless specifically recited in the claim language.

The terms "wireless network", "network", "cellular System", "cell tower" and "radio access point", "internet", "local network" may be used generically and interchangeably herein to refer to any one of various wired or wireless systems. In an embodiment, a wireless network may be a radio access point (e.g., a cell tower), which provides the radio link to the mobile device so that the mobile device can communicate with the core network.

The terms "mobile device," "user device," and "wireless device," may be used interchangeably herein to refer to any one or all of cellular telephones, smartphones, personal data assistants (PDA's), laptop computers, tablet computers, ultrabooks, palm-top computers, wireless electronic mail receivers, multimedia Internet enabled cellular telephones, wireless gaming controllers, IoT devices, and other electronic devices that include a programmable processor, a memory and circuitry for sending and/or receiving wireless communication signals. While the various embodiments are particularly useful in IoT devices, the embodiments are generally useful in any computing device that may be used to wirelessly communicate information.

The term "IoT device" may be used herein to refer to a wireless device that may use radio frequency (RF) communications to communicate with another device, for example, as a participant in a communication network, such as the IoT. Such communications may include communications with another IoT device, a base station (including a cellular communication network base station and an IoT base station), an access point (including an IoT access point), or mobile devices.

The terms "edge device," and "edge computing device" may be used interchangeably herein to refer to a computing device that is configured to perform or implement edge computing techniques or technologies. An edge device may include a programmable processor, various memories, and communications circuitry for establishing communication links to user devices (e.g., smartphones, UEs, IoT devices, etc.) and/or to network components in a service provider, core, cloud, or enterprise network. An edge device may include or implement functionality associated any one or all of an access point, gateway, modem, router, network switch, residential gateway, mobile convergence product, networking adapter, customer premise device, multiplexer and/or other similar devices.

The term "edge computing" may be used herein to refer to systems, techniques or technologies that improve the user experience by offloading computation-intensive tasks from user devices to edge devices or servers deployed at the edge of the networks, thereby freeing up resources on user devices and/or allowing the user device to perform more computations or more resource-intensive tasks. Edge computing may be regarded as a new paradigm for overcoming resource shortages on resource-constrained user computing devices.

The various embodiments include multi-layer PCB and a method of manufacturing the same. In particular, the various embodiments include high density PCBs and methods of manufacturing the same that enable the manufacture of a thin PCB. The embodiments may also overcome various technical challenges and problems that arise when using conventional methods of manufacturing PCBs.

As mentioned above, multi-layer PCBs are more complex than single layer PCB boards, but have many added advantages. Multi-layer PCB boards enable: (1) smaller size verse single layer for same function; (2) increased component density for increased functionality; and (3) improved performance for EMI shielding, impedance control and reduced weight. Some limitations of conventional multi-layer PCBs include: (1) they are not applicable for all applications; (2) there are higher costs compared to single- and double-layer PCBs; and (3) there is an increase in design and manufacturing complexity (i.e., increased cost, etc.).

For commercial reasons multi-layer PCBs, while offering many benefits, need to have the manufacturing costs reduced to facilitate increased miniaturization through circuit densification. The reduction in manufacturing costs with the increased complexity may be achieved at the same time by increasing functionality and reducing the overall bill of materials used for creating the electrical system itself.

Multi-layer PCBs because of their physical geometry, have both thermal (heat) and power challenges that may degrade the performance and overall usefulness. As the component density increases the need for more layers to be included in the multi-layer PCB continues to increase. However, with multi-layer PCBs, the manner in which power and thermal issues are handled is very important to the overall functionality and performance of the electrical system that resides on the PCB.

The embodiments provide a method for increasing the densification of the components in a multi-layer PCB while reducing the bill of materials and improving the functionality of the overall system.

Multi-layer PCBs are essential in the miniaturization of electronic system functionality. The miniaturization using multi-layer PCBs may be achieved through increased circuit densification resulting in a smaller geographic real estate that needs to be used. The miniaturization of the electronic system functionality increases functionality for the same geographic area either by having more components placed on a multi-layer PCB or having several multi-layer PCBs occupy the same real estate that was used by less layered PCBs.

Each PCB, whether it is a single of multi-layer PCB, has a fundamental structure. For example, each layer of the PCB may include a (1) silkscreen; (2) solder mask; (3) metal, usually copper; and (4) substrate.

The silkscreen is the layer that adds letters and numerical indicators that are meant to make functions readable. The silkscreen layer is usually white in color, however other colors may be used.

The solder mask is also called the liquid photo image solder mask (LPISM) and is meant to prevent leakages of liquid solder from locations on the PCB it is not meant to go.

The metal, which is usually copper, may be laminated onto a substrate. The metal may then be etched, providing areas on the PCB that have metal and areas that do not. The metal etching may be used to provide signal routes, traces, thermal dissipation, or connectivity for components on the PCB.

The substrate may be made up of a fiberglass weave that has resin impregnated in it. The substrate may provide a ridged foundation for the PCB. The substrate may either be a prepreg (PP) or core layer depending on the function. A conventional multi-layer PCB typically has several prepreg and core layers. As such, the multi-layer PCB may be a combination of several core and prepreg put together.

As used herein, the terms "prepreg" or "PP" are used interchangeably to refer to so-called "pre-impregnated" composite materials, particularly those made from composite fibers where a thermoset polymer matrix material, such as epoxy, or a thermoplastic resin is already present. In the context of PCBs, prepreg may be formed as a sheet of insulating material used for the multi-layer PCB and is used as an insulting material for the PCB. Prepreg is a fiber weave impregnated with a resin bonding agent. The prepreg is used to stick the core layers together. Without the prepreg there would be nothing there to hold the layers together.

The prepreg (PP) may be mainly used for bonding and insulting each layer of the multi-layer PCB. The prepreg is also semi rigid. The core, however, is more rigid than the prepreg. A core may be one or more prepreg laminates that are pressed, hardened, and cured with heat, and plated with copper foil on each side. The core's function is to provide structural integrity to the PCB.

Some of the other items which make up a PCB include: (1) traces; (2) planes; (3) planlet; (4) VIA; (5) pads (e.g., Term pads); (6) anti-pads; and/or (7) lands.

Traces may be a physical strip of metal (typically copper) that is used to make electrical connections between two or more points on the PCB itself. The trace may carry the electrical signals between the points on a PCB.

Planes may be an uninterrupted area of metal covering a PCB layer. A plane may distribute power or provide a ground for a number of points in a PCB.

A relatively small block or segment of conductive material, such as copper, is referred to herein as a "planlet," or collectively as "planlets." A planlet may be an uninterrupted area of metal that covers part of the PCB layer. It is possible to have several planets covering a single layer in a PCB. The planlet may distribute power or provide a ground for a number of points in a PCB.

A VIA (i.e., a vertical interconnect access) may be a vertical passage that passes through one or more layers of the PCB. The VIA may contain a piece of metal and/or be filled with electrically conductive material that makes electrical connection between several layers of a PCB. In this way, VIAs may provide an electrical path for signals, power, or ground between layers in the PCB.

A VIA pad may be small area in or on a PCB that may include electrically conductive material and/or non-conductive material. VIA pads with conductive material may be configured to provide electrical connections between layers and/or components of the PCB. VIA Pads may be used to connect the VIA(s) to traces, planes, or planlets.

An antipad may be a VIA pad or a small area of a VIA pad that is devoid of electrically conductive material (e.g., metal) and may be used in planes and are not meant to provide electrical connectivity.

A land may be a pad that is exposed on the outer layer of the PCB, and which may be used to connect a surface mounted device (SMD) to the PCB. Electrical connections to the lands may be done through one or more VIAs and/or traces.

With multi-layer PCBs an important design parameter is the layer thickness. The PCB layer thickness as well as the number of layers defines the total multi-layer PCB thickness. The PCB thickness and spacing between layers defines the signal trace impedance, cross talk and parasitic inductance.

FIG. 1 is an illustration of an 8-layer multi-layer PCB 100. In the example illustrated in FIG. 1, the multi-layer PCB 100 includes 8 layers (i.e., layers 1-8) of metal (e.g., copper, etc.) with multiple prepreg (PP) and cores. More specifically, the multi-layer PCB 100 illustrated in FIG. 1 includes metal layers 102, 106, 110, 114, 118, 122, 126 and 130, each of which may include signals, power traces, and/or shapes components (e.g., for controlling inductance, trace width, the shape and impedance of the signal or path, etc.). Metal layers 106, 114, 122 and 130 also include a ground (GND).

The multi-layer PCB 100 also includes a plurality of prepreg (PP) substrate layers 104, 112, 120, 128 and a plurality of core substrate layers 108, 116, 124. As mentioned above, prepreg (PP) substrate layer may include a sheet of insulating material that provides bonding and insulting for each layer of the multi-layer PCB.

FIG. 2 is an illustration of a 12-layer multi-layer PCB 200. In the example illustrated in FIG. 2, the multi-layer PCB 200 includes 12 layers (i.e., layers 1-12) of metal with multiple prepreg (PP) and cores in between. More specifically, the multi-layer PCB 200 illustrated in FIG. 2 includes metal layers 202, 206, 210, 214, 218, 222, 226, 230, 234, 238, 242 and 246, each of which may include signals, power traces, and/or shapes components. Metal layers 206, 214, 222, 230, 238 and 246 also include a ground (GND).

The multi-layer PCB 200 also includes a plurality of prepreg (PP) substrate layers 204, 212, 220, 228, 236, and 244. The multi-layer PCB 200 includes a plurality of core substrate layers 208, 216, 224, 232, 240.

The prepreg (PP) and cores shown in FIG. 1 and FIG. 2 are normally dispersed in the layers, stack layers. In the 8-layer multi-layer PCB shown in FIG. 1 the prepreg (PP) and core (C) relationship is PP-C-PP-C-PP-C-PP. While the prepreg and core relationship in FIG. 2 is PP-C-PP-C-PP-C-PP-C-PP-C-PP.

In a multi-layer PCB, the standard design process is to have several cores along with prepregs (PPs). The relationship in FIG. 1 could be PP-PP-C-PP-C-PP-PP however standard design practices call for PP-C-PP-C-PP-C-PP. The number of cores used in a multi-layer PCB is meant for rigidity since the core is a fiberglass laminate.

To provide rigidity the core in a multi-layer PCB is typically significantly thicker than the prepreg (PP). The core thicknesses which are used for construction of 0.062" thick multilayers are 0.005", 0.008", 0.014", 0.021, 0.028", and 0.039".

Prepreg (PP) may be similar to a core, with the basic material with the two having completely different functions. A prepreg may be curled while the core is rigid and resists bending. The prepreg is not conductive, and the core typically has a metal layer on both sides which is the conductive medium of the PCB.

The prepreg (PP) may have a metal layer adhered to both of its sides like a core with the exception that it is not as rigid as a core would be. By placing metal on both sides of the prepreg additional rigidity is provided by the prepreg. By having several prepregs (PPs) with metal on both sides the collective strength of the several prepregs may replace the need for one or more cores in a multi-layer PCB.

To facilitate further miniaturization the thickness of the multi-layer PCB may be further reduced by removing the need for having multiple cores. The prepreg (PP) while having similar characteristics of the core may be used for multi-layer PCB structural integrity.

In addition, by sandwiching multiple prepregs (PPs) together a significant reduction in the multi-layer PCB thickness may be achieved resulting in a lower stack height. The prepreg (PP) height may be similar to that of the core height. The use of the prepregs (PPs) as part of the overall structural integrity of the multi-layer PCB board is a novel approach.

However, if the core is metallic and not fiberglass the rigidity of the multi-layer PCB is increased as well as the thermal dissipation a core height may be significantly reduced. For instance, a core height is achievable of less than 0.003 inches and with the prep height reduction results in a significant reduction in overall stack height with a 12 layer PCB having a total height of 1 m or less which is significantly less than that of a FR4.

FIG. 3 illustrates a 12-layer multi-layer PCB 300 that has a single core. In the example illustrated in FIG. 3, the multi-layer PCB 300 includes a first signals layer 302, and a first prepreg substrate 304 abutting, adjacent, a top, below, adjoining, bordering, conterminous, contiguous, flanking, flush with, fringing, joining, juxtaposed, neighboring, skirting, touching, verging, attaching, communicating with, connecting, interconnecting, joining, linking, or uniting (herein collectively abutting) the first signals layer 302. The multi-layer PCB 300 also includes a first ground plane layer 306 abutting the first prepreg substrate 304, a second prepreg substrate 308 abutting the first ground plane layer 306, a first inner signal layer 310 abutting the second prepreg substrate 308, a third prepreg substrate 312 abutting the first inner signal layer 310, a second inner signal layer 314 abutting the third prepreg substrate 312, a fourth prepreg substrate 316 abutting the second inner signal layer 314, a second ground plane layer 318 abutting the fourth prepreg substrate 316, a fifth prepreg substrate 320 abutting the second ground plane layer 318, a third inner signal layer 322 abutting the fifth prepreg substrate 320, a core substrate 324 abutting the third inner signal layer 322, a fourth inner signal layer 326 abutting the core substrate 324, a sixth prepreg substrate 328 abutting the fourth inner signal layer 326, a third ground plane layer 330 abutting the sixth prepreg substrate 328, a seventh prepreg substrate 332 abutting the third ground plane layer 330, a fifth inner signal layer 334 abutting the seventh prepreg substrate 332, an eighth prepreg substrate 336 abutting the fifth inner signal layer 334, a sixth inner signal layer 338 abutting the eighth prepreg substrate 336, a ninth prepreg substrate 340 abutting the sixth inner signal layer 338, a fourth ground plane layer 342 abutting the ninth prepreg substrate 340, a tenth prepreg substrate 344 abutting the fourth ground plane layer 342, and a second signals layer 346 abutting the tenth prepreg substrate 344.

The illustrated example, the first signals layer 302 is a top signals/power-traces and shapes layer. The second signals layer 346 is a bottom signals power-traces and shapes layer.

The single core 224 allows for the multi-layer PCB 300 to be further miniatured by reducing the number of cores, and thus reducing the overall multilayer stack height of the multi-layer PCB 300.

Additionally, in FIG. 3 the pegs or prepregs (PPs) may be used with a resin, which provides more structural and thermal dissipating capabilities allowing for smaller overall thickness of the combined multi-layer PCB.

The unique design of having a single core with the multi-layer PCB 300, in the layout PP-PP-PP-PPPPC-PP-PP-PP-PP-PP, is meant to not only reduce the stack height but also control impendence within the multi-layer PCB.

With multi-layer PCBs there are numerous signal traces and reference planes. The combination of a signal trace and a reference plane may form a transmission line. All input and output signals in a PCB system travel through transmission lines. With PCB and especially multi-layer PCBs good signal integrity is dependent on having transmission lines with controlled impedance.

As with all multi-layer PCBs increasing the metal (e.g., copper) thickness increases the cross-sectional area of the circuit traces and the amount of current they may reliability pass. Increasing the copper thickness is used to minimize real estate on the PCB surface since without increasing the copper thickness the traces would need to be wider resulting in less densification of the components capable with a multi-layer PCB.

Signals in a multi-layer PCB may be currents (not voltages). As frequency increases, resistance becomes less and less important. Inductance begins to dominate the impedance which may negatively impact the performance of the multi-layer PCB through increased noise and return currents.

Noise is generated inside the device and is coupled out in many different possible ways in a multi-layer PCB. The noise may be present on all outputs, inputs, power supply, and ground at all times. With every pin on the microcomputer potentially being a noise source.

As such, a large problem in multi-layer PCBs is noise from the integrated-circuit (IC) that comes from the input/output (I/O) pins. This is because this area is covered by traces connected to them on the PCB and forming a large antenna. These pins also connect to both internal and external devices and connectors.

Another source of noise is the power-supply system, which includes the voltage regulation and the bypassing capacitors at both the regulator and at the microcomputer.

A third noise source is the oscillator circuit.

With signaling very edge transition that is sent from the microcomputer to another chip is a current pulse. Loops exist everywhere. Any noise voltage and its associated current travels the path(s) of lowest impedance back to the place where it was generated.

Noise in a multi-layer PCB appears as both differential and common mode noise.

Differential-mode noise is the noise of a signal as it travels down its trace to the receiving device, then back along the return path. There is a differential voltage between the two wires and is caused by every signal. There should be no differential between the signal and its return.

However common mode noise is the voltage difference that occurs because of impedance along the path the signal takes. Ground bounce is an example of common mode noise.

While the dielectric constant of the laminate varies from board to board, it may be fairly constant within one board layer. Therefore, the relative impedance of transmission lines in a PCB is defined most strongly by the trace geometries and tolerances. Impedance variance may occur based on the presence or absence of glass in a local portion of the laminate weave which becomes more critical with high speed interfaces that exceed 1Gbps. Impedance in a multi-layer PCB may change based on the frequency that transverses the signal trace.

With a multi-layer PCB noise may be coupled by: (1) conducted: two currents in the same copper; (2) Near-field Magnetic (inductors and transformers); (3) Near-field Electric (capacitors); and (4) Far-field Electromagnetic (RF).

As with all signals DC return current follows the lowest resistance while AC (RF) return current follows the lowest impedance. Minimizing the impendence with a multi-layer PCB with reduced prepreg (PP) and core sizes helps in minimizing the layer to layer impedance at high frequencies due the distance between and layers is less than 10% of the highest frequency used thereby minimizing coupled noise effects.

The reduction in distance between the top and bottom layer in a multi-layer PCB enables the multi-layer PCB to be used in extremely high frequency allocations while facilitating miniaturization through component densification.

Figure 4A:
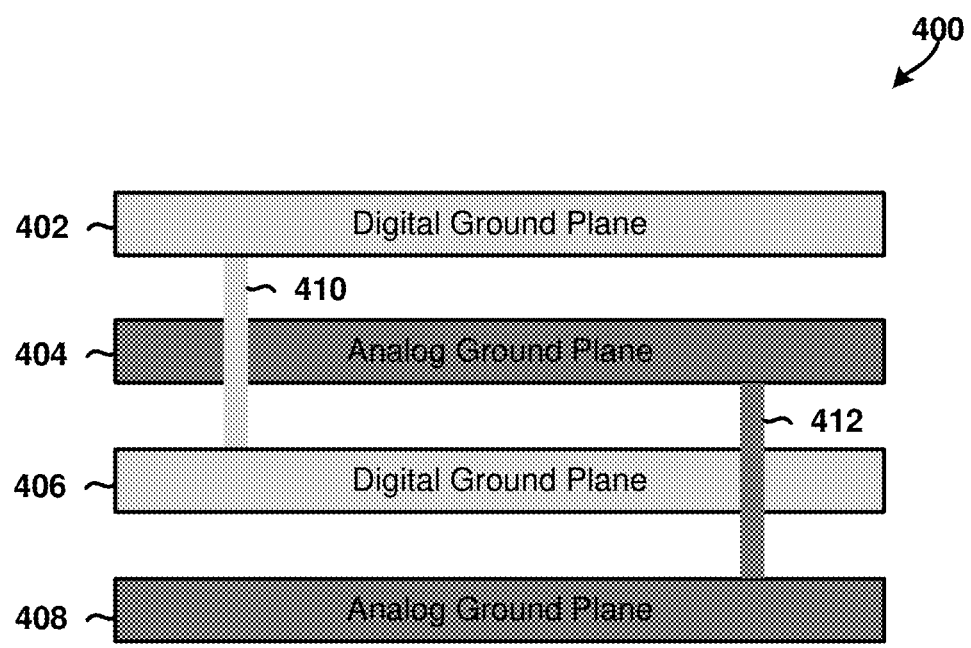
FIG. 4A is a component block diagram that illustrates a multi-layer PCB that includes separate analog and digital grounds.

FIG. 4A illustrates a grounding system 400 that includes separate analog and digital grounds in accordance with some embodiments. The grounding system 400 includes digital ground planes 402, 406 and analog ground planes 404, 408. The digital ground planes 402, 406 are coupled together via a lead 410. The analog ground planes 404, 408 are coupled together via a lead 412.

A standard design practice in multi-layer PCBs is to separate the analog and digital ground planes to improve the performance as shown in FIG. 4A. This is largely done for impedance reasons and to prevent digital signal transitions from negatively impacting the performance of an analog device. The alternating stack location of analog and digital grounds in FIG. 4A is used as an example and many perturbations are possible.

However, with improved filter and Power Distribution management the need to have separate analog and digital grounds is not needed.

Figure 4B:
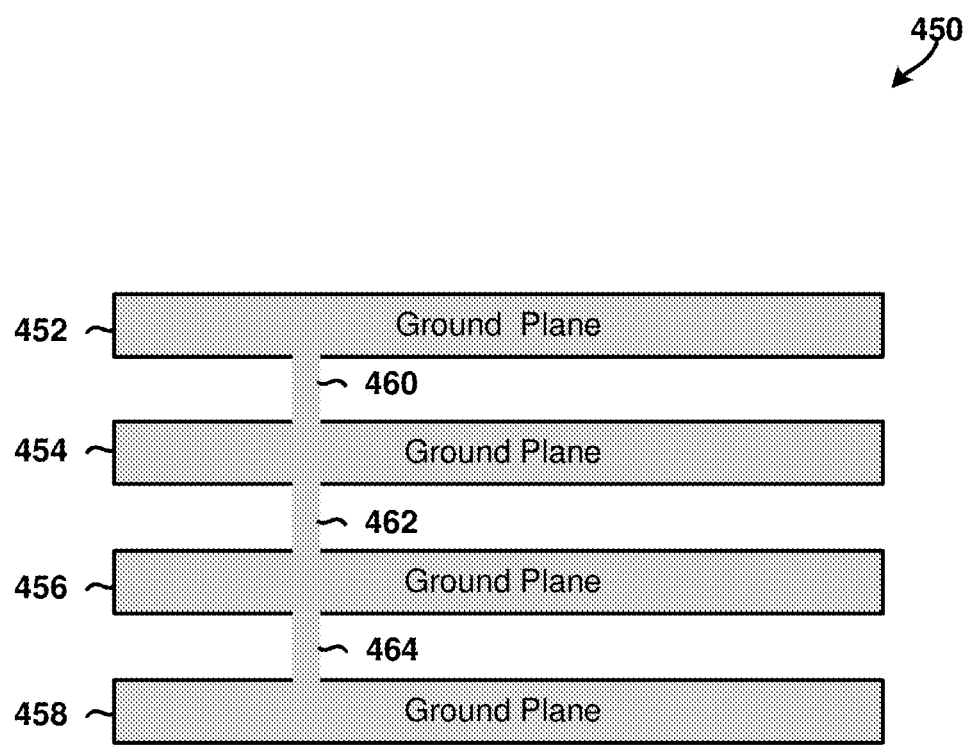
FIG. 4B is a component block diagram that illustrates a multi-layer PCB that includes a common ground.

FIG. 4B illustrates a shared grounding system 450 in accordance with some embodiments. The shared grounding system 450 includes ground planes 452-458 that are coupled together via one or more leads 460-464. This is, the first, second, third and fourth ground plane layers (i.e., layers 452-458) provide a shared common ground for analog and digital signals. This configuration (i.e., of the shared grounding system 450) improves noise and power distribution, reduces decoupling caps with equivalent for better impendence matching, and separates grounds from signal traces to improve circuit/PCB density.

In FIG. 4B all the grounds in the multi-layer PCB are shared and act as one large ground. Utilizing a common ground plane for both digital and analog signals may further reduce the stack size needed leading to increased miniaturization. The sharing of a common ground plane for digital and analog signals also allows for a significant savings in manufacturing cost due to the need for less metal.

The common ground plane enables a common voltage reference for all the devices in the multi-layer PCB. However, by sharing a common connection conducted noise may be increased because when current flows in any conductor a magnetic field is generated.

If current flows in ground plane a differential voltage may be set up resulting in the reference being unequal in the PCB.

Capacitor Parasitic Inductance is typically a value is often considered to be the most important characteristic. In power system applications, the parasitic inductance (ESL) has the same or greater importance. Capacitor package dimensions (body size) determine the amount of parasitic inductance. Physically small capacitors usually have lower parasitic inductance than physically large capacitors. Surface-mount chip capacitors are the smallest capacitors available and are a good choice for discrete decoupling capacitors.

Filter capacitors are used in a multi-layer PCB to reduce unwanted noise. However, capacitors are frequency dependent as well as adding impedance. The capacitor's effectiveness is reduced based the overall impendence of the capacitor and impedance introduced through the overall loop area the capacitor interacts with. The higher the frequency of noise the easier it is for the parasitic impedance to isolate the filter caps.

Figure 5:
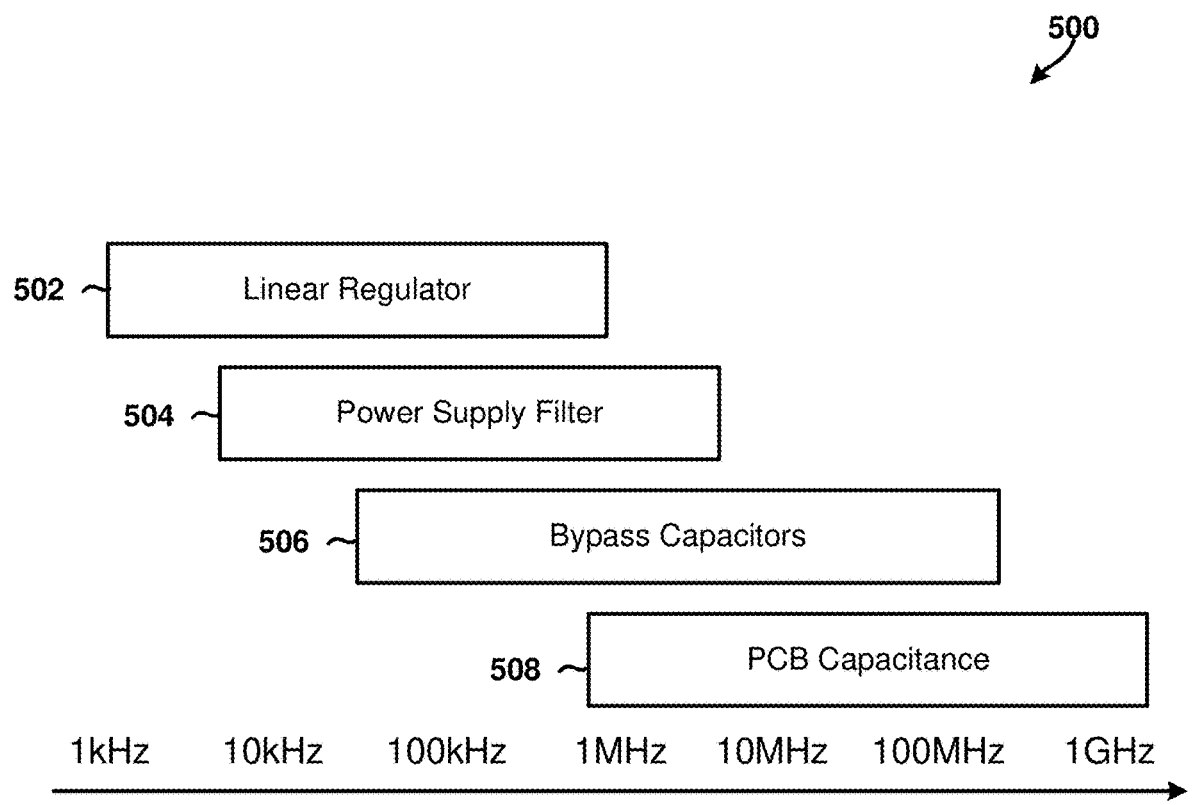
FIG. 5 is a component block diagram that illustrates the relationship between capacitance filtering and frequency in a multi-layer PCB configured in accordance with some embodiments.

FIG. 5 illustrates frequency responses for noise reduction on a multi-layer PCB 500. In particular, FIG. 5 illustrates the relationship between bypass capacitors used on a multi-layer PCB 500 and the PCB capacitance itself.

In the example illustrated in FIG. 5, the multi-layer PCB 500 includes a linear regulator 502, a power supply filter 504, bypass capacitors 506, and a PCB capacitance 508 unit.

Capacitance (508) in a multi-layer PCB is directly related to the cross section of the stack layer, the dielectric properties of the prepreg (PP) and core, and the distance between the individual and collective stack layers.

However, another method of reducing the overall impedance is to reduce the amount of filter or bypass capacitors utilized on the multi-layer PCB.

Every capacitor has a narrow frequency band where it is most effective as a decoupling capacitor. This band is centered at the capacitor's self-resonant frequency FRSELF. The effective frequency bands of some capacitors are wider than others. A capacitor's ESR determines the capacitor's quality (Q) factor, and the Q factor may determine the width of the effective frequency band.

It is important to distinguish between the capacitor's self-resonant frequency and the mounted capacitor's effective resonant frequency when the capacitor is part of the system.

Mounted parasitic inductance is a combination of the capacitor's own parasitic inductance and the inductance of the PCB lands, connecting traces, VIAs, and power planes.

Decoupling capacitors are quite frequently implemented to reduce the impedance of a power distribution network and provide the required charge to the switching circuits, lowering the power supply noise.

A decoupling capacitor is most effective at the narrow-frequency band around its resonant frequency, and thus, the resonant frequency must be reviewed when choosing a capacitor collection to build up a decoupling network.

The decoupling capacity has two primary goals: (1) charge supply; and (2) filtering.

Charge supply: They allow local charge supply and are considered as charge reservoirs. The purpose is for circuits operating at higher switching speeds enabling them to have quick access to the charge reservoir to draw the required current. Decoupling capacitors are an effective way to provide the required charge to a switching current load within a short period of time. The decoupling capacitors are also used to keep the power rail transient voltages within design limits for the circuit.

Filtering: The noise due to the switching of the transistors may be shunted to ground by use of the decoupling capacitor. The decoupling capacitors reduce the voltage supply, VDD (i.e., positive supply voltage), and/or core noise. The decoupling capacitor may also help suppress the cavity noise generated by high bandwidth signals.

Figure 6A:
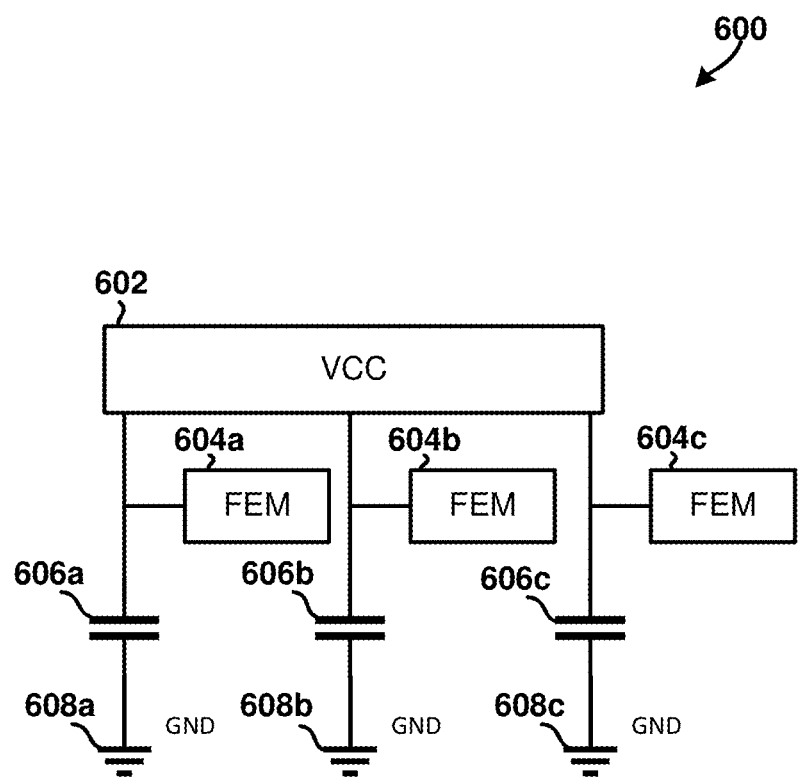
FIGS. 6A and 6B are component block diagrams that illustrate decoupling capacitors that could be included in a multi-layer PCB configured in accordance with some embodiments.
Figure 6B:
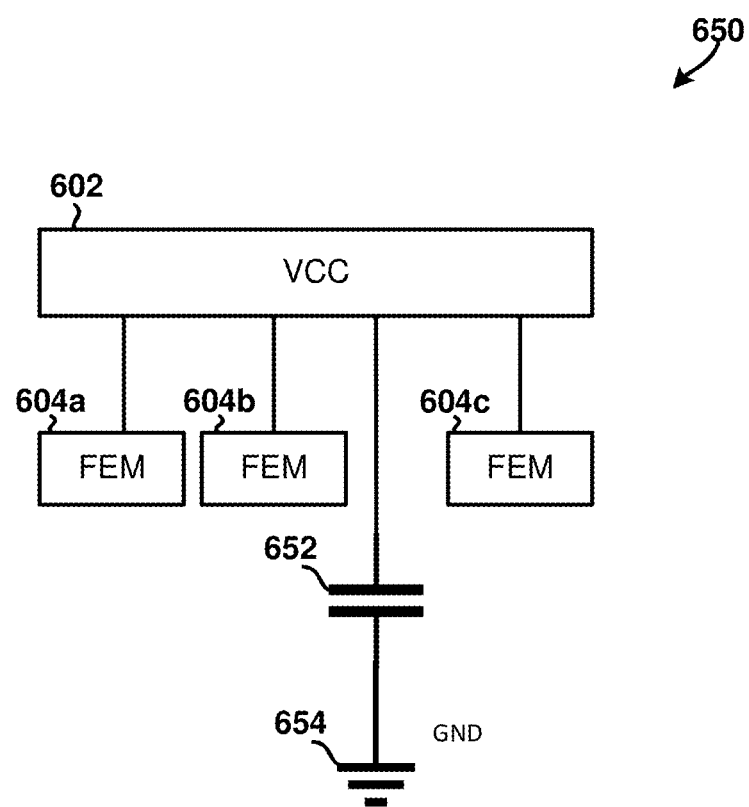

FIG. 6A illustrates a circuit 600 that includes a voltage common collector 602 component, a plurality of finite element method (FEM) components 604a-c, a plurality of decoupling capacitors 606a-c, and a plurality of grounds 608a-c components. FIG. 6B illustrates a circuit 650 that includes shared decoupling capacitors 652 coupled to ground 654.

Industry design practice for decoupling, bypass, capacitors involve having one bypass capacitor per discrete device as shown in FIG. 6A. However, the number of bypass capacitors may be reduced in a multi-layer PCB. The number of bypass capacitors may be reduced by grouping bypass capacitors together and treating them as parallel capacitors thereby using a larger value bypass capacitor in place of multiple bypass capacitors as shown in FIG. 6B.

The combining of multiple bypass capacitors results in reducing the amount of board real estate needed for all the bypass capacitors and reduces the overall component cost since less discrete components are needed. The reduction in discrete components also reduces manufacturing costs as allows for a standard bypass capacitor to be utilized.

The reduction in the number of decoupling capacitors allows for one capacitor size to be used predominantly. The reduction in the variety of decoupling capacitor sizes also helps reduce the overall cost and eases manufacturing.

The reduction in the decoupling capacity values used for the multi-layer PCB also insures a steady state of power for the circuit. The reduction in the decoupling capacitor values used also leads to a larger overall decoupling capacitor being used. The larger decoupling capacitor has a better voltage verse temperature ratio allowing the circuit to perform better in thermally challenged environments which also include enclosures that are fanless.

The decoupling capacitor is also complemented by the multilayer stack overall capacitance. The PCB layers using a prepreg (PP) with metal also add an additional capacitance for filtering. By adjusting the thickness of the prepreg along with the dialectic of the prepreg the stack layer may be viewed as a capacitor used for additional filtering for high frequency noise.

Current spreads out as it flows from one point to another in both the power and ground planes, very similar to skin effect. The inductance in these planes is spreading inductance where the shape of the plane and not its size determined the amount of inductance.

Spreading inductance resists the capacitor's ability to respond to transient current and needs to be minimized.

For high-frequency power distribution systems, power and ground planes work in pairs, with their inductances coexisting dependently with each other. The spacing between the power and ground planes determines the pair's spreading inductance. The closer the spacing (the thinner the dielectric), the lower the spreading inductance.

As the plane area increases and as the separation between power and ground planes decreases, the value of this capacitance increases.

In a multi-layer PCB having the ground layers introduced that cover the entire stack layer along with the prepreg (PP) small footprint along with the dielectric used increases the overall capacitance used for improved filtering.

Power and ground should be run directly over each other, which reduces impedance and minimizes loop area.

Signal Return Grounds: a loop is made by a signal, and the ground return path from the receiver device back to the signal source. Signal return paths present the most difficult design problem in PCB layout Reducing the loop area by routing the return for the signal underneath the signal trace is most effective way of dealing with this problem. Therefore, creating a ground grid is the most important thing to do after floor planning in laying out the PCB.

However distributed capacitance of the power routing may become the source for noise at higher frequencies. To counter this ferrite beads are used to suppress the unwanted signal. Thus, the ferrite bead blocks the sourcing of RF current from the power line connection.

Ferrite beads are meant to be placed for every power input to the circuit in a multi-layer PCB. A ferrite core in series with the power feed is an effective low-pass filter for the input power rails. A ferrite bead may have a very high impedance at high frequencies and almost negligible impedance at low frequencies.

However, at high frequencies the extensive use of ferrite beads while providing filtering also alters the impedance load on the power source.

Figure 7A:
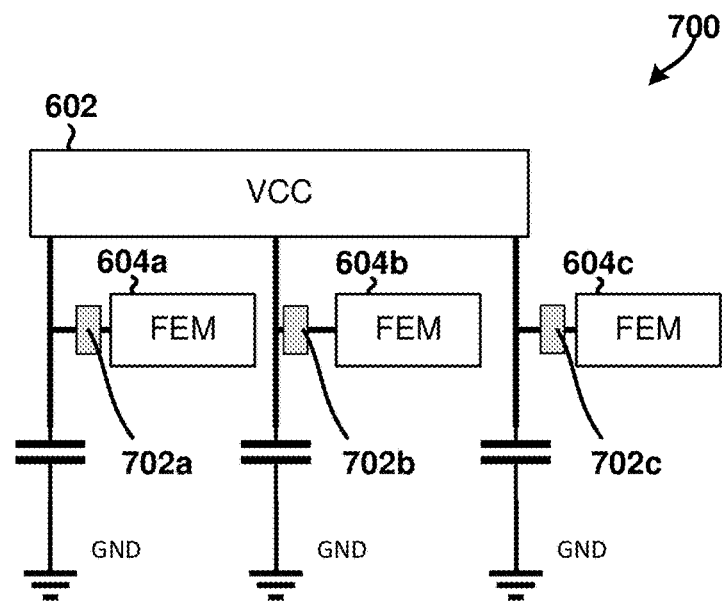
FIGS. 7A-7D are component block diagrams that illustrate ferrite beads that could be included in a multi-layer PCB configured in accordance with some embodiments.
Figure 7B:
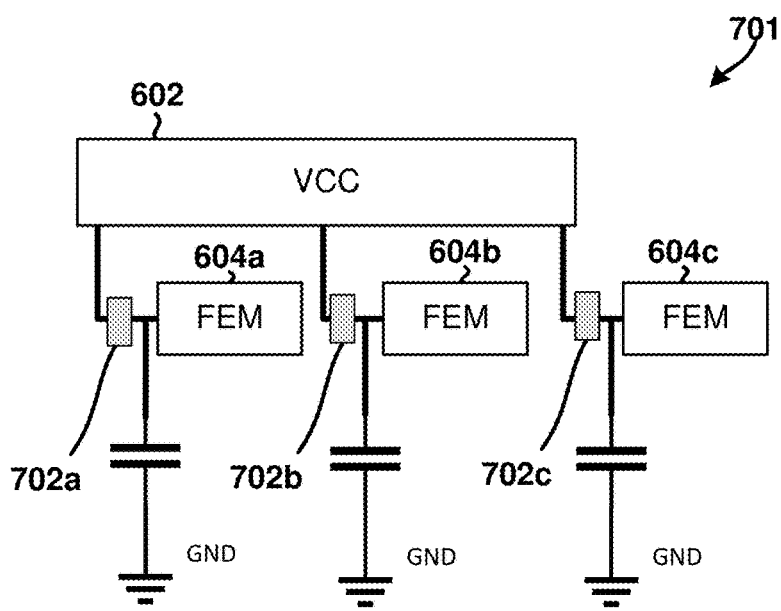
Figure 7C:
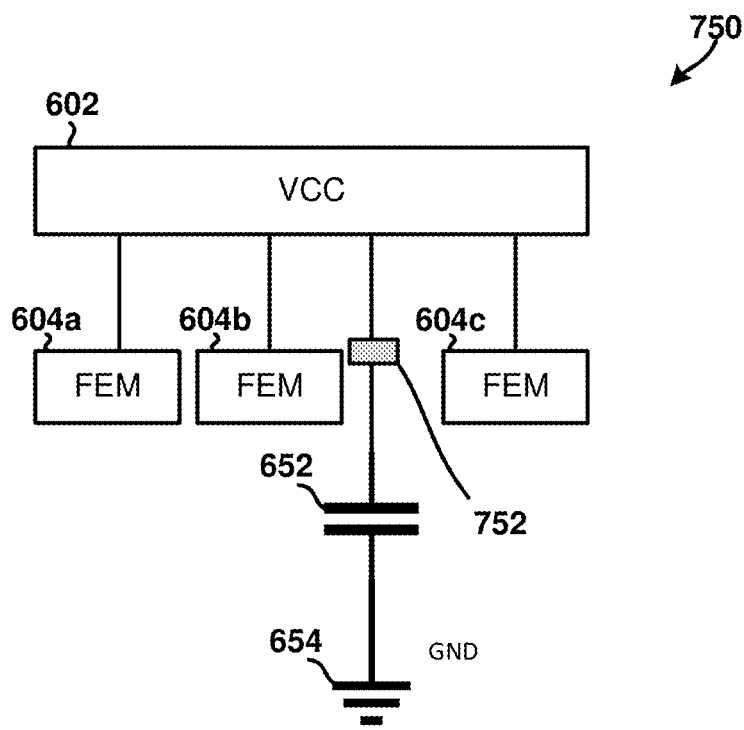
Figure 7D:
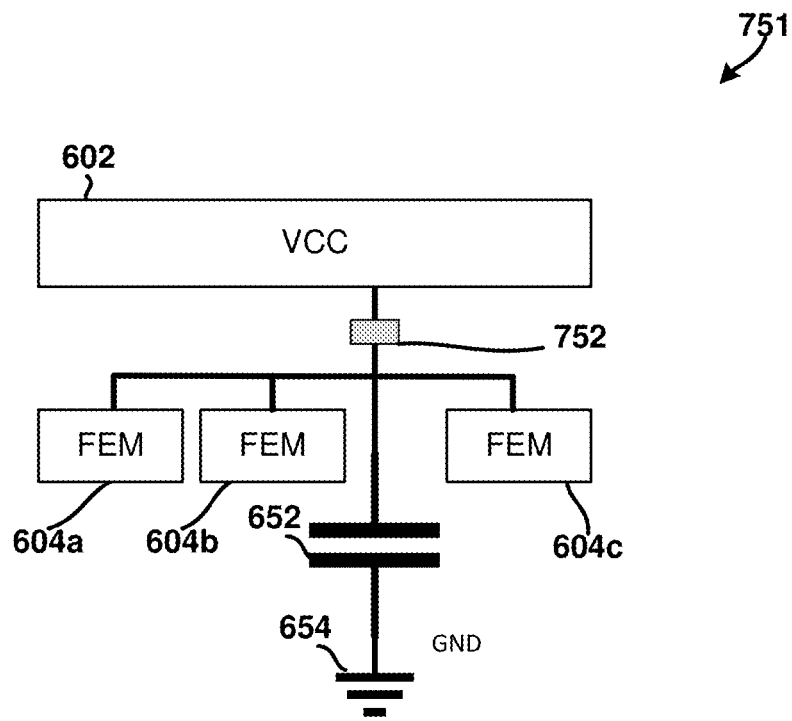

FIG. 7A illustrates a circuit 700 that includes one ferrite bead 702a-c per FEM 604a-c. FIG. 7B illustrates an alternative circuit 701 that includes one ferrite bead 702a-c per FEM 604a-c located as shown. In particular, in FIG. 7B, each ferrite bead 702a-c is moved to the other side of the inductor. FIG. 7C illustrates a circuit 750 that includes one ferrite bead 752 for N FEM components 604a-c (i.e., 1-to-N ferrite bead to FEM ratio). FIG. 7D illustrates an alternative circuit 751 that includes one ferrite bead 752 for N FEM components 604a-c (i.e., 1-to-N ferrite bead to FEM ratio) located as shown. In particular, in FIG. 7D, the ferrite bead 752 is moved to a position between the VCC components 602a-c and all the FEM 604a-c, as well as the shared decoupling capacitors 652 and the ground 654.

Standard practice is to use a ferrite bead per FEM as shown in FIGS. 7A and 7B. However, with the use of a decoupling cap scheme shown in FIG. 6B it is possible to reduce the amount of ferrite beads used. In FIGS. 7C-7D the number of ferrite beads is reduced so there is one ferrite bead per N FEMs.

Through selective use of the ferrite beads instead of using the design practice of a ferrite bead per power input improves the impedance match with the power supply. The benefit of the impedance match with the power supply results in a better power transfer from the power rail to the circuit allowing the circuit to operate from a lower rail voltage and overall reduced power consumption. The reduced power consumption also reduces the thermal loading on the circuit enabling the circuit to be used in thermally challenged environments including those requiring a fanless enclosure.

With and PCB and especially with a multi-layer PCB the correct design of the power supply filter helps eliminate many problems and improves power supply efficiency.

The power distribution system (PDS) or power distribution network (PDN) is made up of a regulator and multiple stages of bypass, decoupling capacitors, that accommodates the device current demand and responds to current transients as quickly as necessary to maintain the voltage within the specified limits.

When these current demands are not met, the voltage across the device's power supply changes. This is observed as noise. Inductance in the current path of the capacitors should be minimized because it retards the ability of decoupling capacitors to quickly respond to changing current demands.

The use of 1:N ferrite beads per FEM improves the overall PDN impedance match with the voltage regulator. The improved impedance match helps deliver the maximum amount of power for a changing load.

Having the power and ground planes next to each other on a single stack layer creates what is called planner capacitance effecting the overall frequency response as well as stack layer impedance. The specific geometry of the ground and power planes on the stack layer contributes largely to the overall planer capacitance.

The planer capacitance may be used to help improve the noise and filtering by making their relationship specific to higher frequency filtering and thereby contribute to the overall noise reduction scheme implemented in the multi-layer PCB.

Impedance is a function of resistance, capacitance, and inductance and varies over frequency. The impedance seen by the power supply and the circuit should be maintained in a system such that the power supply noise doesn't exceed a maximum value. The power supply noise shouldn't exceed the target impedance.

Power delivery network (PDN) design is critical for providing clean power to integrated circuits, such as field-programmable gate arrays (FPGAs) and other electronic devices. A PDN consists of a voltage regulator and decoupling capacitor.

The job of the voltage regulator is to provide power to the circuit. As the power draw load changes the voltage regulator adjusts the amount of current it is supplying to keep the output voltage constant.

The decoupling capacitor works in conjunction with the voltage regulator. The decoupling capacitor functions as the device's local energy storage for delivering additional power when needed.

Figure 8A:
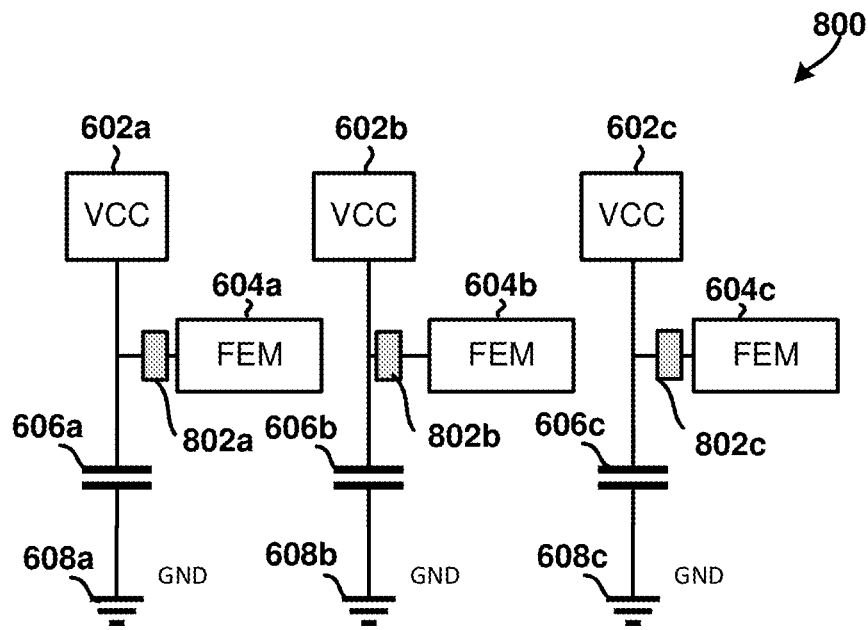
FIGS. 8A-8D are component block diagrams that illustrate power delivery network (PDN) for multi-layer PCB configured in accordance with some embodiments.
Figure 8B:
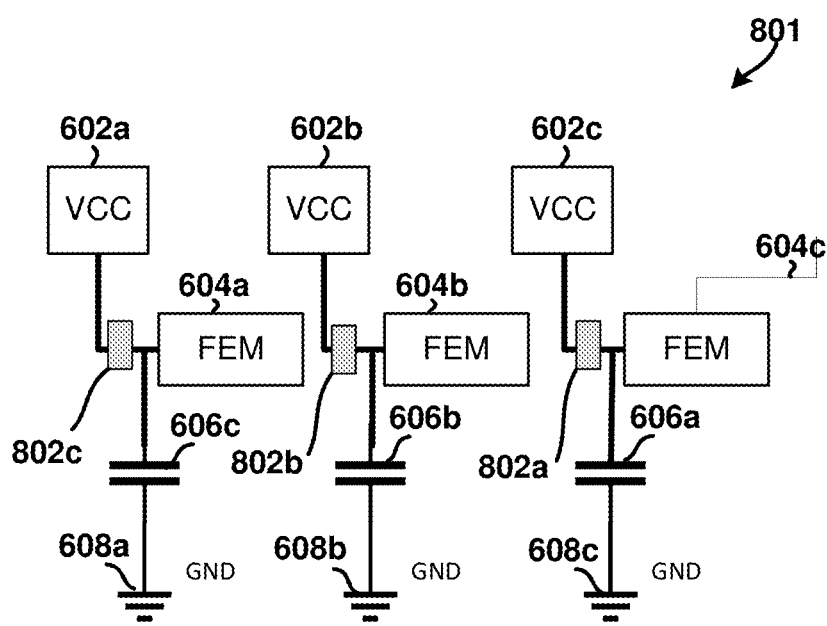
Figure 8C:
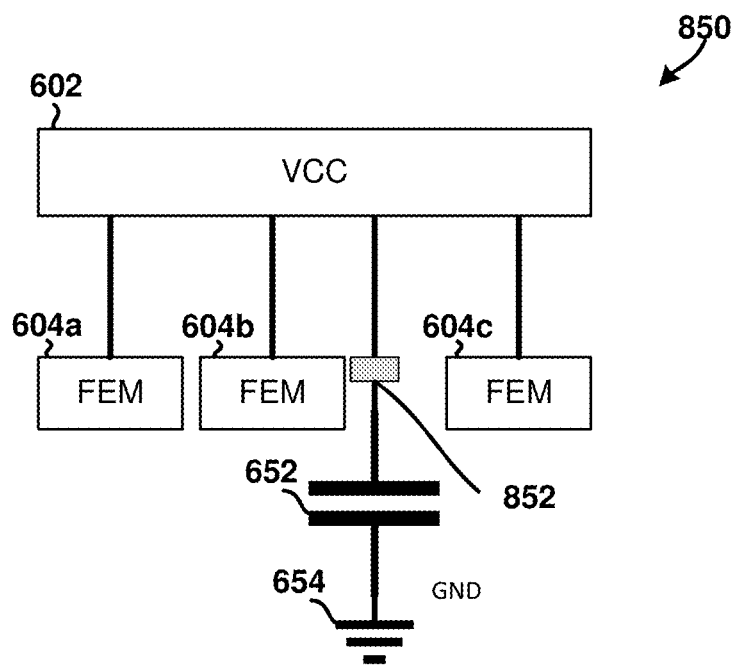
Figure 8D:
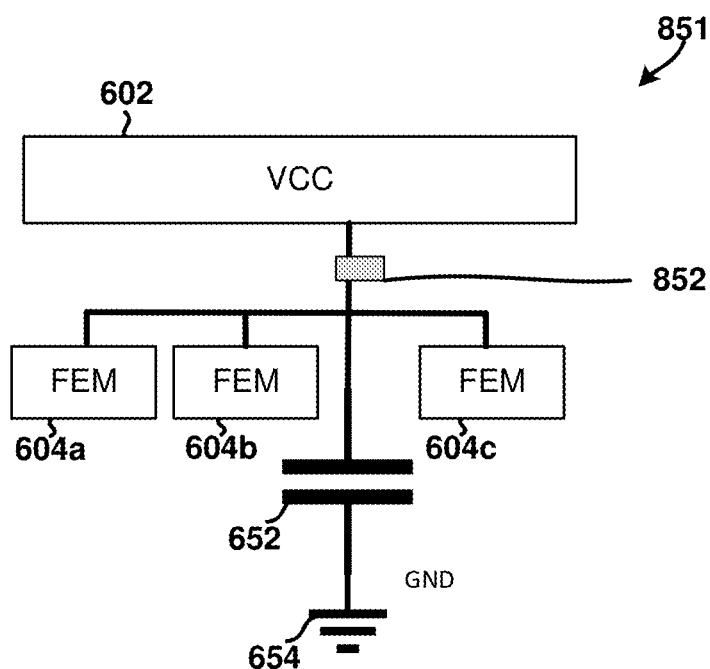

FIG. 8A illustrates a multi-layer PCB 800 that includes multiple VCC components 602a-c and a single PDN 802a-c for each of the plurality of FEM components 604a-c. FIG. 8B illustrates an alternative multi-layer PCB 801 that includes multiple VCC components 602a-c and a single PDN 802a-c for each of the plurality of FEM components 604a-c, but with each single PDN 802a-c moved to the other side of the decoupling capacitors 606a-c and plurality of grounds 608a-c. FIG. 8C illustrates a multi-layer PCB 850 that includes a common PDN 852 for multiple FEM components 604a-c. FIG. 8D illustrates an alternative multi-layer PCB 851 that includes a common PDN 852 for multiple FEM components 604a-c, but with the common PDN 852 moved to a position between the VCC component 602 and all the FEM 604a-c, as well as the shared decoupling capacitors 652 and the ground 654.

A multi-layer PCB has several PDNs that are used for delivering power to all the circuits. Typically, there is a PDN for each module that is used on the multiplayer PCB. The use of multiple PDNs is a common and well understood design practice as shown in FIG. 8A. The separate power patch is used to isolate each power supply for each subcomponent and sensitive electronics.

However, a single PDN may be used for many functional element modules, circuits as shown in FIG. 8B. The single PDN reduces the amount of PDN patches, grids or sections that are associated with a multi-layer PCB. The single PDN for many functional elements is possible due to the improved filtering and decoupling capacitance scheme utilized. The single PDN also reduces the complexity of the power distribution scheme avoiding the need to grid parts of each stack layer used for delivering the power to the circuit. The common PDN also reduces the overall cost of the circuit by reducing the amount of voltage regulators needed to provide the power source for each component.

The reduction in electron footprint with miniaturization of the PCB may increase the localized heating, which may have an adverse effect on the performance of many electronic items. The increase in heat associated with a miniaturized PCB board may be directly related to the various components being placed closer to each other. The closeness of the various components complicates the use of heat sinks for heat removal or transfer. However, for PCB miniaturization one item that needs to be overcome is heat removal.

One solution for heat removal may involve forced air flow, which may be a very effective method of heat removal. However, not all electronic devices have fans or utilize forced air flow to facilitate heat removal. Thus, whether or not an electronic device, PCB, or other platform has forced air (e.g., with or without a fan), heat removal may benefit product performance. Therefore, active electronic devices may have heat mitigation issues, which are further increased within a miniaturized PCB board if not addressed. Also, as the PCB board is reduced in size and the various components are placed closer to each other, heat removal or transfer becomes even more imperative.

In accordance with various aspects disclosed herein, the solution to the heat removal or transfer for miniaturized PCBs may involve passing the heat from one layer of the PCB board to another through a vertical interconnect access (VIA) or more than one VIA. A VIA may be a vertical passage that passes through one or more layers. For example, VIAs may connect the two exterior layers by extending all the way through all the layers, from the top layer to the bottom layer. The VIAs may be formed by drilling through the layers, through laser ablation, or other techniques. Alternatively, a VIA may be what is referred to herein as a "blind VIA," which goes through a top layer or a bottom layer and extends to an intermediate layer, but not all the way through all the layers. A further alternative VIA may be what is referred to herein as a "buried VIA," which goes through one intermediate layer and extends to another intermediate layer only, but never reaches either of the opposed outer layers.

VIA's can be plated or un-plated depending on the application and purpose. A plated VIA is lined with a thin coating or film of a different material. Un-plated VIAs may be used for mounting and alignment purposes while plated VIAs are meant for conductive and/or non-conductive paste or material to be used. Thus, at least some of the VIAs may be formed with or include a conductive material configured to enable electrical signals and or heat to flow from one PCB layer to another. An example of a conductive material that may be used is solder and/or conductive paste. A non-conductive material that can be used for filling the VIA is a thermal interface material, which can be used for better heat transference. Alternatively, other materials may be used alone or in addition to the plating to line the inner walls of one or more VIA.

In accordance with various embodiments, as part of the heat removal or transfer process, one or more VIAs may alternatively or additionally be used for transferring heat via convection. To transfer heat via convection, a VIA may include a hollow inner passage. Thus, while one or more of the VIAs may be filled with conductive material for communicating electrical signals, one or more other VIAs may not be completely filled, leaving a hollow inner passage extending between layers. In fact, one or more of the VIA may remain completely empty (i.e., no fill). When not completely filled with conductive material (i.e., maintaining a hollow inner passage), the VIA may act as a thermal chimney. In this way, the VIA may provide a path for the heat to be transferred from one layer to another. Alternatively, one or more of the VIAs may be filled or partially filled with non-conductive material.

Figure 9:
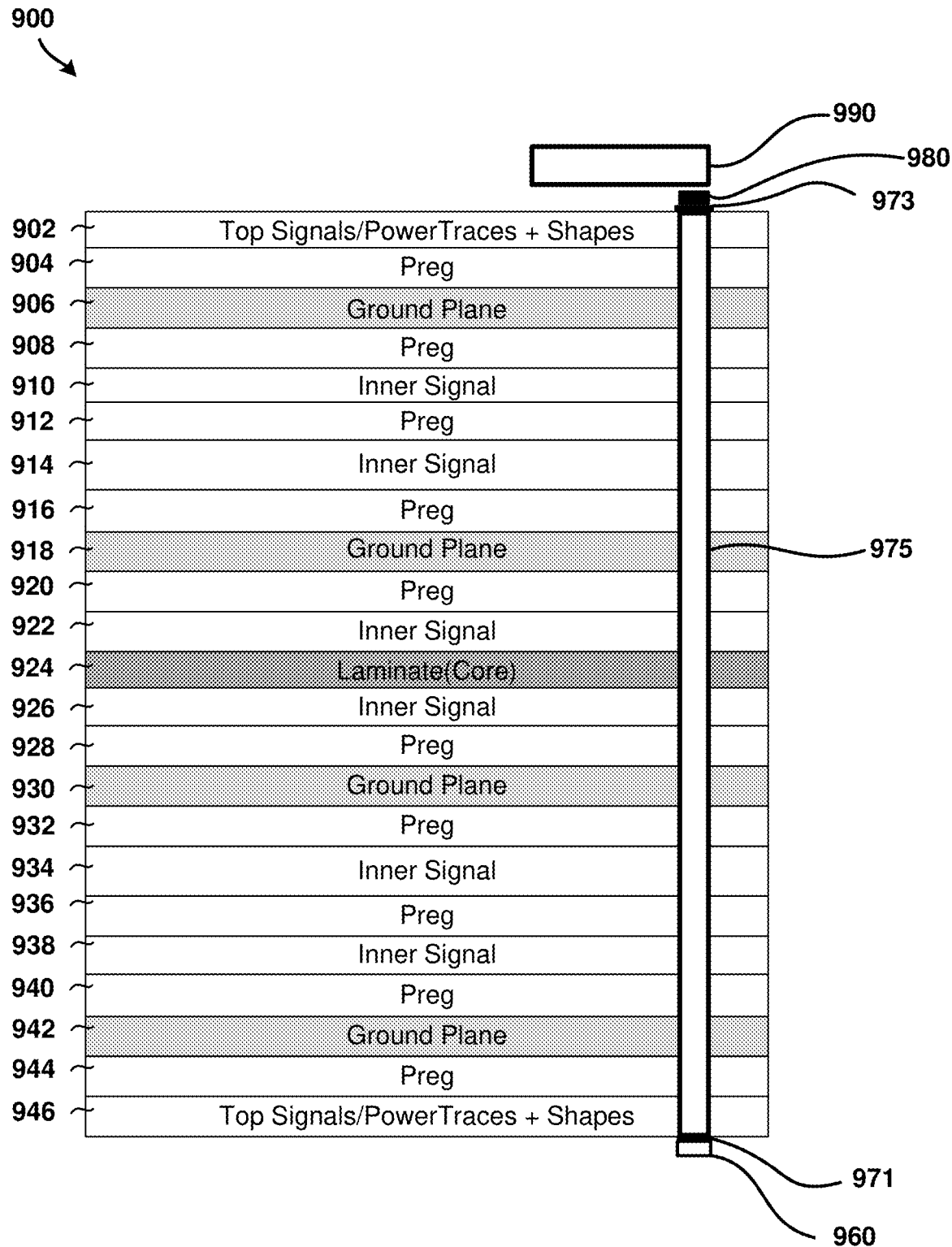
FIG. 9 is a cross-sectional side elevation view of a multilayer PCB that includes a plurality of layers in accordance with some embodiments.

FIG. 9 illustrates a multilayer PCB 900 that includes a plurality of layers 902-946, one or more VIAs 975, and a VIA bridge 980 configured to convey heat from at least one of the one or more VIAs to a heat sink. 990. The plurality of layers 902-946 includes:

1. a pair of signal layers 902, 946,
2. a plurality of prepreg substrate layers 904, 908, 912, 916, 920, 928, 932, 936, 940, 944 disposed between the pair of signal layers 902, 946,
3. a plurality of ground plane layers 906, 918, 930, 942, wherein each of the plurality of ground plane layers 906, 918, 930, 942 abuts one of the plurality of prepreg substrate layers (e.g., 904, 908, 916, 920, 928, 932, 940, 944),
4. a plurality of inner signal layers 910, 914, 922, 926, 934, 938, wherein each of the plurality of the inner signal layers 910, 914, 922, 926, 934, 938 abuts one of the plurality of prepreg substrate layers (e.g., 908, 912, 916, 920, 928, 932, 936, 940), and
5. a core substrate layer 924 disposed between the pair of signal layers 902, 946, wherein two of the plurality of inner signal layers (e.g., 922, 926) abut opposed sides of the core substrate layer 924.

The one or more VIAs 975 may extend through one or more of the plurality of layers 902-946, offset from an outer edge of the plurality of layers 902-946. In this way, the one or more VIAs 975 are disposed in an inner area of each of the plurality of layers 902-946, which inner area is offset from an outer perimeter of the layers 902-946. In FIG. 9, the one or more VIAs 975 are illustrated as a single column, representing a hollow passageway, extending through the layers 902-946 of the PCB 900. However, the one or more VIAs 975 may include more than one hollow passageway extending parallel to one another (e.g., see FIGS. 10A-13C). Each of the one or more VIAs 975 may be formed by aligned apertures through adjoining ones of the plurality of layers 902-946. In particular, the one or more VIAs 975 may extend through at least one of the plurality of prepreg substrate layers (e.g., 904, 908, 912, 916, 920, 928, 932, 936, 940, 944), at least one of the plurality of ground plane layers (e.g., 906, 918, 930, 942), and at least one of the plurality of inner signal layers (e.g., 910, 914, 922, 926, 934, 938). In this way, each set of aligned apertures through adjoining ones of the plurality of layers 902-946 form an individual continuous passage through several the plurality of layers 902-946. In addition, although the one or more VIAs 975 are illustrated as a single unitary passage extending through all the layers 902-946, the one or more VIAs 975 may include multiple parallel VIAs that extend through all or some of the layers 902-946.

The VIA bridge 980 may provide a better method of heat transference from the IC and or other PCB component(s) to a heat sink 990. The heat sink 990 may have a thermal interface layer disposed between the heat sink 990 and the VIA bridge 980 for electrical isolation, while also allowing for thermal transference.

In some embodiments, the VIA bridge 980 may straddle an IC to provide heat transference, a power supply, and/or signaling. The VIA bridge 980 may be secured to the PCB 900 through a mechanical method, such as soldering.

In various embodiments, the PCB 900 may also include a pair of term pads 971, 973, at opposite ends of the one or more VIAs 975, outside the outer layers 902, 946. The term pads 971, 973 may help facilitate connections between layers and/or components. The VIA bridge 980 may be soldered to one of the term pads 971, 973. The term pads 971, 973 may be composed of a conductive material, such as the same material that is used for PCB layer traces. The term pads 971, 973 can be round, square or any shape and/or variation in dimension that provides a connection with the VIA 975 and the signal traces on the PCB layer, whether it is an internal layer or external layer. Surrounding the VIA pad 971, 973 may be an area of nonconductive material where the VIA pad 971, 973 is insulated from the other conductive material for the PCB layer traces. In some embodiments, one or both of the VIA pads 971, 973 may be formed of non-conductive material, which is referred to an antipad. VIAs 975 that do not include electrically conductive material may not need to terminate at a VIA pad 971, 973.

The VIA pads 971, 973 between layers can be bonded to each other via a mechanical method, such as by pressing. The VIA pads between the layers can also be bonded to each other using solder or some other bonding material.

The term pads 971, 973 may provide terminal interfaces at the opposite ends of the VIAs 975, particularly for VIAs. In this way, the PCB 900 includes a lower term pad 971 and an upper term pad 973. Alternatively, depending on the heat dissipation requirements for the PCB 900, there may be additional term pads that provide heat transference from the plurality of layers 902-946.

In addition, the multilayer PCB 900, as shown in FIG. 9, may include an integrated circuit (IC) 960 or other device requiring heat removal. While various embodiments herein refer to an "IC" as the device requiring heat removal, alternatively or additionally embodiments may include one or more other devices requiring heat removal. This reference herein to the "integrated circuit" or "IC" may include any device requiring heat removal. The IC 960 may be attached outside an outer layer, such as outside one of the pair of signal layers 902, 946. For example, FIG. 9 illustrates the IC 960 attached to the lower signal layer 946, through the lower term pad 971 disposed between the IC 960 and the lower signal layer 946. The lower signal layer 946 may be configured for top signals or power traces and shapes. The IC 960 may be attached to a lower term pad 971, such as by soldering or through a thermal interface material which conducts heat only. The thermal interface material may be a silicon rubber, non-silicone rubber, paste, or some other nonconductive material that can also be used for heat transference. Alternatively, the IC 960 could be attached to the upper term pad 973, for example with the rest of the elements inverted and attached to the lower side of the PCB 900 (e.g., a VIA bridge 980 or a heat sink 990).

In accordance with various embodiments, the VIAs 975 may benefit from an additional interface between the term pads 971, 973 and either the IC 960 or the heat sink 990. While components like the IC 960 or the heat sink 990 may be directly connected to the term pads, such as by soldering, alternatively a thermal interface material may be placed between the term pads 971, 973 and the IC 960 and/or heat sink 990 for improve thermal conductance.

One or multiple VIAs 975 may be connected to the same term pad 971, 973. The VIAs 975 between the lower term pad 971 and the upper term pad 973 may be configured to enable heat transfer via convection and/or provide electric conductivity such as through a VIA. The upper term pad 973 may be connected to the VIA bridge 980, which may have a single leg or multiple legs acting as a conduction bridge. The VIA bridge 980 may be formed of conductive material and mounted to connect to more than one VIA 975 in order to provide a conductive connection between select VIAs 975 that include portions of a VIA. Like the individual layers 902-946 that include apertures, the VIA bridge 980 may include an aperture aligned with one or more of the VIAs 975 it conductively couples in order to enable thermal transfer from through the upper term pad 973 to a heat sink 990 mounted above it.

Figure 10A:
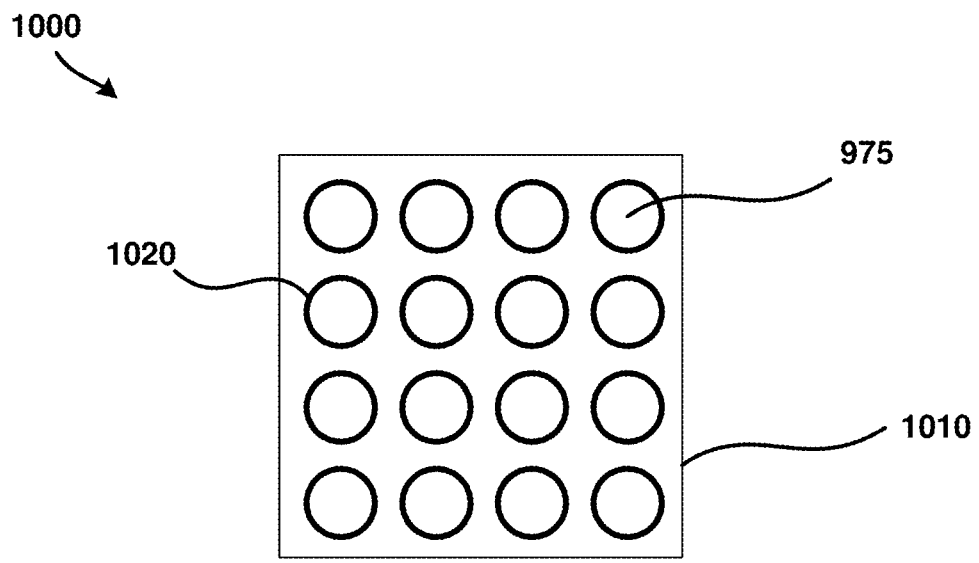
FIGS. 10A and 10B are top views of arrays of VIAs visible through a term pad in accordance with some embodiments.

FIG. 10A illustrates a top view of an array 1000 of sixteen (16) VIAs 975 viewed from above a term pad 1010 that includes sixteen (16) apertures 1020 evenly distributed across the term pad 1010 in four (4) rows and four (4) columns. The term pad with multiple VIAs is also referred to as a "VIA farm." Each one of the apertures 1020 may be configured to align vertically with individual VIAs 975. In this way, the apertures 1020 of the term pad 1010 may be configured to align with up to sixteen separate VIAs 975. The term pad 1010 may be formed of similar materials to the term pads (e.g., 971, 973) described above with regard to FIG. 9.

In FIG. 10A, the individual apertures 1020 and the corresponding VIAs 975 associated therewith are illustrated as not being filled with a conductive material. The VIAs 975 cab be plated or not plated. In this way, the individual apertures 1020 and the corresponding VIAs together form convection passages that are hollow and configured to promote heat transfer via convection. Although the term pad 1010 is illustrated as having a generally square shape, alternatively the term pad 1010 may be formed into any shape appropriate for the PCB and/or the application. Similarly, while the apertures 1020 are round, alternatively the apertures 1020 may be formed into any shape appropriate for the PCB and/or the application. In addition, although the term pad 1010 is illustrated as having sixteen (16) apertures, alternatively the term pad 1010 may have a greater or fewer number of apertures 1020.

In accordance with various embodiments, the apertures 1020 of the term pad 1010, as well as the corresponding VIAs 975, are isolated from each other with no conductive material connecting any individual aperture 1020 to another aperture 1020. However, alternatively one or more of the apertures 1020 may be connected to one or more of the other apertures 1020, such as with a conductive material forming a VIA bridge (e.g., 980). The individual apertures 1020 and corresponding VIAs 975 may be filled with a conductive material, partially filled with conductive material, or have no lining or fill and be simply a hole extending through multiple layers of the PCB 900. Whether one or more of the individual apertures 1020, the corresponding VIAs, or portions thereof are filled with conductive material, partly filled, or not filled may depend upon the application and specific thermal transference requirements needed to be fulfilled.

One of the purposes of the VIAs 975 is to provide a physical path for the heat to flow. In this way, heated air or other fluids may be configured to flow through the VIAs to enable heat transfer. As depicted in FIG. 9, the path from the IC (e.g., 960) to the heatsink (e.g., 990) may pass through the VIAs 975 extending between and through the lower term pad 971 and the upper term pad 973.

Figure 10B:
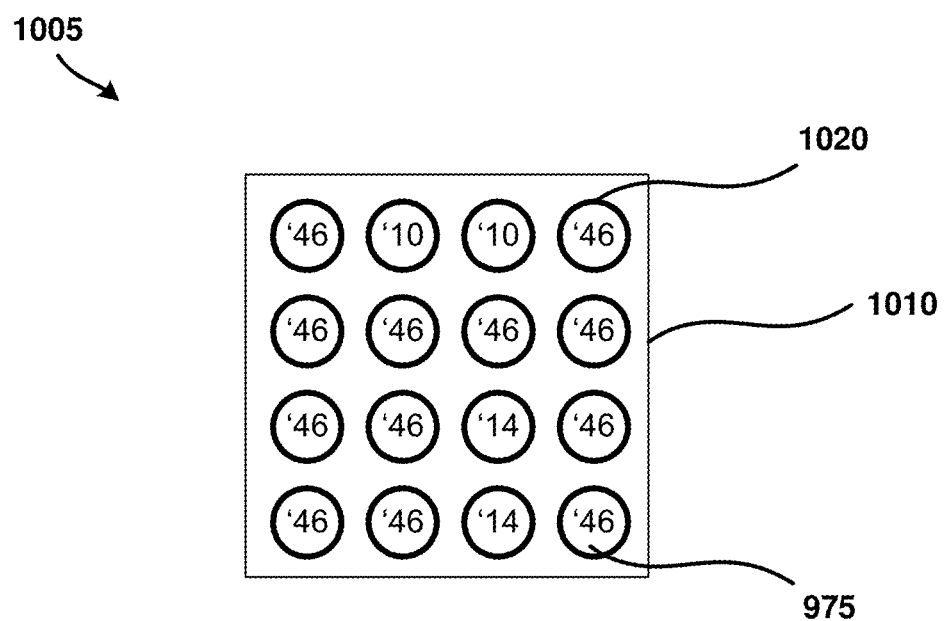

FIG. 10B illustrates a top view of another array 1005 of sixteen (16) VIAs 975 viewed from above the term pad 1010 that also includes sixteen (16) apertures 1020 evenly distributed across the term pad 1010 in four (4) rows and four (4) columns. In accordance with various embodiments, in contrast to the array 1000 in FIG. 10A, the array 1005 in FIG. 10B includes VIAs 975 that do not extend as a hollow passage completely through all the layers (e.g., 902-946) of the PCB (e.g., 900). In this way, some of the apertures 1020 may lead to VIAs that only extend part way through the layers. FIG. 10B shows some of the apertures 1020 that lead to VIAs passing entirely through all the layers, while some other apertures 1020 lead to VIAs that terminate at inner layers (e.g., 910, 914).

In FIG. 10B the number indicated in the apertures 1020 denotes the layer to which that aperture 1020 is connected for purposed of convective heat transfer. Since all the layers (e.g., 902-946) in FIG. 9 are numbered in the 900's, the numbers indicated in the apertures 1020 in FIG. 10B abbreviate the layer they lead to by replacing the "9" with an apostrophe ("'"). Thus, the apertures 1020 indicated as "'46" may be aligned with VIAs used to transfer heat from the top layer (e.g., 902) to the bottom layer (e.g., 946) or vice versa. In contrast, other ones of the apertures 1020 indicated as "'10" may be aligned with VIAs used to transfer heat from the top layer (e.g., 902) to the top-most inner signal layer (e.g., 910) or vice versa. Similarly, yet other ones of the apertures 1020 indicated as "'14" may be aligned with VIAs used to transfer heat from the top layer (e.g., 902) to the second highest inner signal layer (e.g., 914) or vice versa. In this way, VIAs may be used to transfer heat from an inner layer to an outer layer or vice versa. Alternatively, the VIAs may be configured to extend as hollow passages only between inner layers. For example, one or more VIAs may transfer heat from the top-most inner signal layer (e.g., 910) to the more centrally located second ground plane layer (e.g., 918) or vice versa.

The extent to which the VIAs extend as hollow passages between layers and/or transfer heat may depend upon the physical dimensions of the components and PCB layouts. For a VIA that does not convey heat across all the layers, the VIA may be hollow or partially hollow across the layers it does convey heat and may be filled-in, such as with conductive material, across those layers it does not convey heat. For example, a VIA that conveys heat between the top-most inner signal layer (e.g., 910) and the lower signal layer (e.g., 946) may be solid between the top-most signal layer (e.g., 902) and the upper ground plane layer (e.g., 906), while having a hollow or partially hollow passage extending from the upper ground plane layer (e.g., 906) to the lower signal layer (e.g., 946).

Figure 11A:
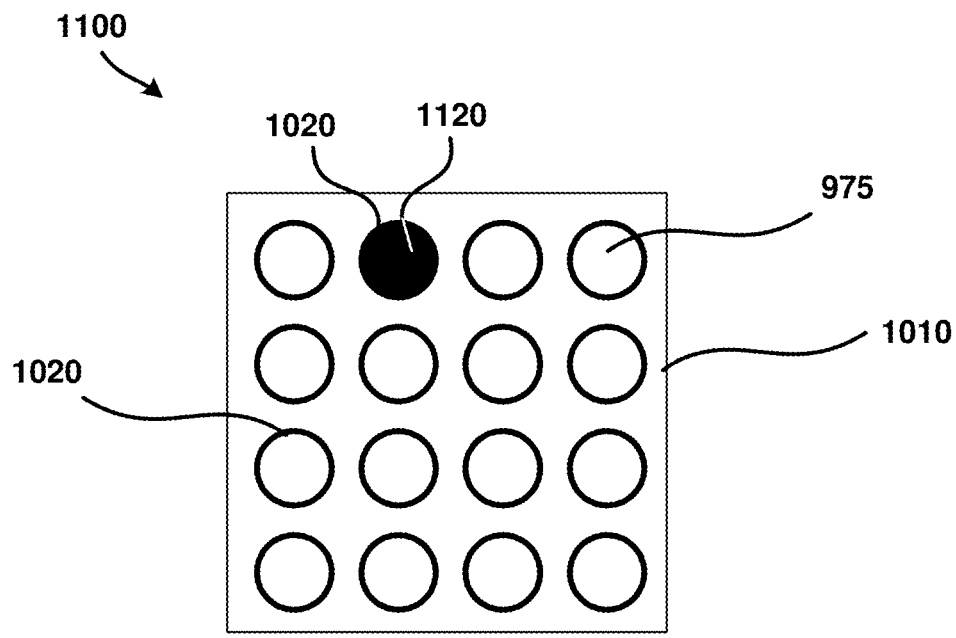
FIGS. 11A and 11B are top views of alternative arrays of VIAs visible through a term pad in accordance with some embodiments.

FIG. 11A illustrates a top view of another array 1100 of sixteen (16) VIAs 975 viewed from above the term pad 1010 that again includes the sixteen (16) apertures 1020. In accordance with various embodiments, in contrast to the arrays 1000, 1005 in FIGS. 10A and 10B, the array 1100 in FIG. 11A includes one aperture 1020 containing a fill 1120 that fills the entire VIA with conductive material. As a conductive material, the fill 1120 may be used for signal transfer between layers. In FIG. 11A, the other fifteen (15) apertures of the array 1100 are illustrated as extending as hollow passages through all the layers (e.g., 902-946). Alternatively, any number of the other fifteen (15) apertures of the array 1100 may contain fill 1120 as needed for the particular application.

Alternatively, the fill 1120 may be a thermal interface material that maximizes heat transfer, such as silicone or non-silicone material. Thermal interface materials may be used for heat transference to account for various orientations of the device where heat may not necessarily flow up and the location of the IC may require that the heat be directed in direction other than up. For example, a VIA may be filled with a thermal interface material to facilitate heat transference to the sides of the device where a heat sink can be located. The heat sink can have mechanical dimensions that are designed based on the orientation to provide the necessary convection thermal transfer.

Figure 11B:
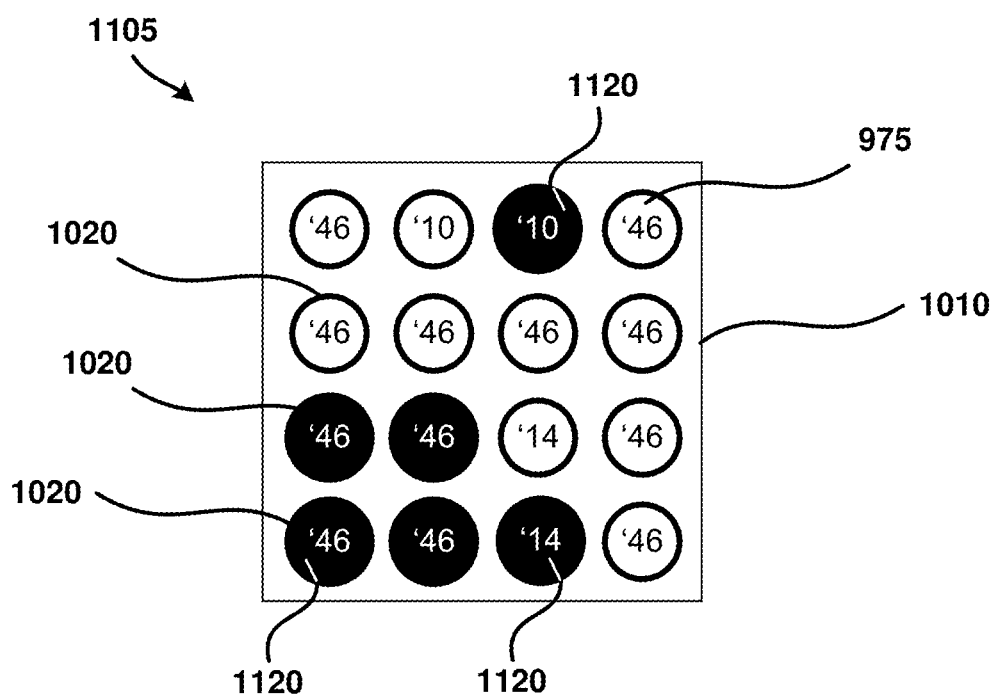

FIG. 11B illustrates a top view of another array 1105 of sixteen (16) VIAs 975 viewed from above the term pad 1010 that again includes the sixteen (16) apertures 1020. In accordance with various embodiments, only a portion of a vertical extend of one or more of the VIAs 975 may contain fill 1120, which fills that portion of the passage with conductive material. FIG. 11B shows an embodiment in which some of the VIAs 975 are filled with conductive material vertically through all the layers (e.g., 910, 914), some that are filled with conductive material vertically through only a select few of the layers, some that contain no fill in the VIAs, and some that contain no fill and are hollow through only a select few of the layers. Alternatively, the fill 1120 may include or be entirely composed of non-conductive material to provide thermal transference.

In FIG. 11B the number indicated in the apertures 1020 denotes the layer to which that aperture 1020 is filled with conductive material. As described above with regard to FIG. 10B, the numbers indicated in the apertures 1020 in FIG. 11B abbreviate the layer they are filled to by replacing the "9" with an apostrophe ("'"). Thus, the apertures 1020 indicated as "'46" represent VIAs in which all the layers contain fill (e.g., 1120) from the top layer (e.g., 902) to the bottom layer (e.g., 946) or vice versa. In contrast, other ones of the apertures 1020 indicated as "'10" represent VIAs in which the layers are filled from the top layer (e.g., 902) to the top-most inner signal layer (e.g., 910) or vice versa. Below the top-most inner signal layer (e.g., 910) of the apertures 1020 indicated as "'10," the VIA may be hollow or contain a nonconductive fill. Similarly, yet other ones of the apertures 1020 indicated as "'14" represent VIAs in which the layers are filled from the top layer (e.g., 902) to the second highest inner signal layer (e.g., 914) or vice versa. Again, below the second highest inner signal layer (e.g., 914) of the apertures 1020 indicated as "'14," the VIA may be hollow or contain a nonconductive fill. In this way, VIAs may be used to convey signals from an inner layer to an outer layer or vice versa. Alternatively, the VIAs may be filled with conductive material only between inner layers. For example, one or more VIAs may contain fill (e.g., 1120) from the top-most inner signal layer (e.g., 910) to the more centrally located second ground plane layer (e.g., 918) or vice versa.

Figure 12A:
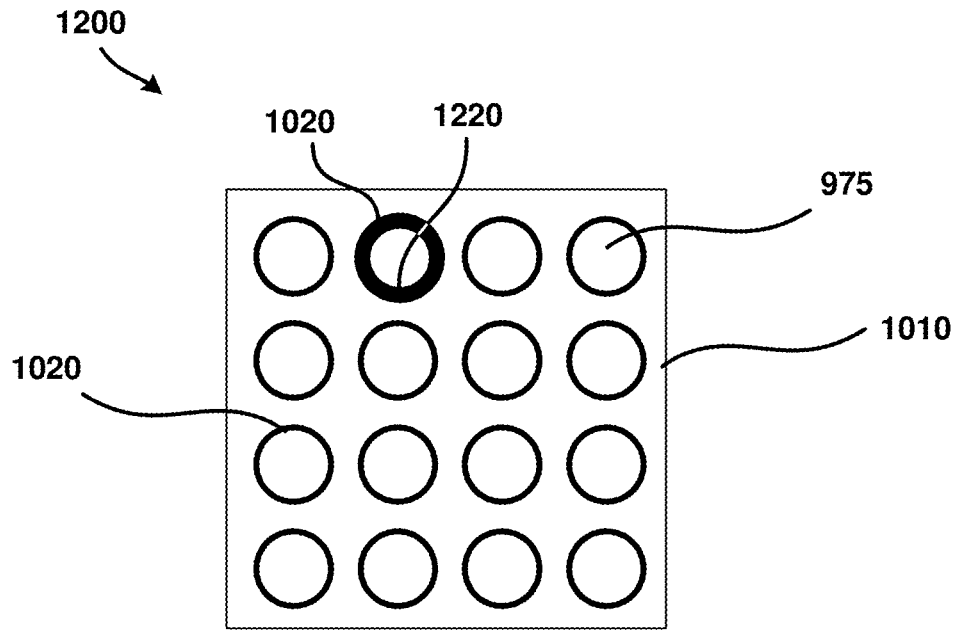
FIGS. 12A-12D are top views of further alternative arrays of VIAs visible through a term pad in accordance with some embodiments.

FIG. 12A illustrates a top view of another array 1200 of sixteen (16) VIAs 975 viewed from above the term pad 1010 that again includes the sixteen (16) apertures 1020. In accordance with various embodiments, in contrast to the arrays 1000, 1005, 1100, 1105 in FIGS. 10A-11B, the array 1200 in FIG. 12A includes one aperture 1020 containing an annular fill 1220 of conductive material that does not completely fill the cross-sectional area of the VIA 975. The annular fill 1220 maintains a hollow passage extending vertically that may promote convection, while also containing a portion of conductive material capable of conveying signals between layers. In the embodiment shown in FIG. 12A, the conductive material is formed as a lining of the inner circumference of the VIA. In this way, the hollow passage extends vertically within the electrically conductive material.

In FIG. 12A, the other fifteen (15) apertures of the array 1200 are illustrated as extending as hollow passages through all the layers (e.g., 902-946). Alternatively, any number of the other fifteen (15) apertures of the array 1200 may contain a conductive material that does not completely fill the cross-sectional area of the VIA, thus leaving a hollow space that may promote convection, while also containing a portion of conductive material capable of conveying signals between layers.

Figure 12B:
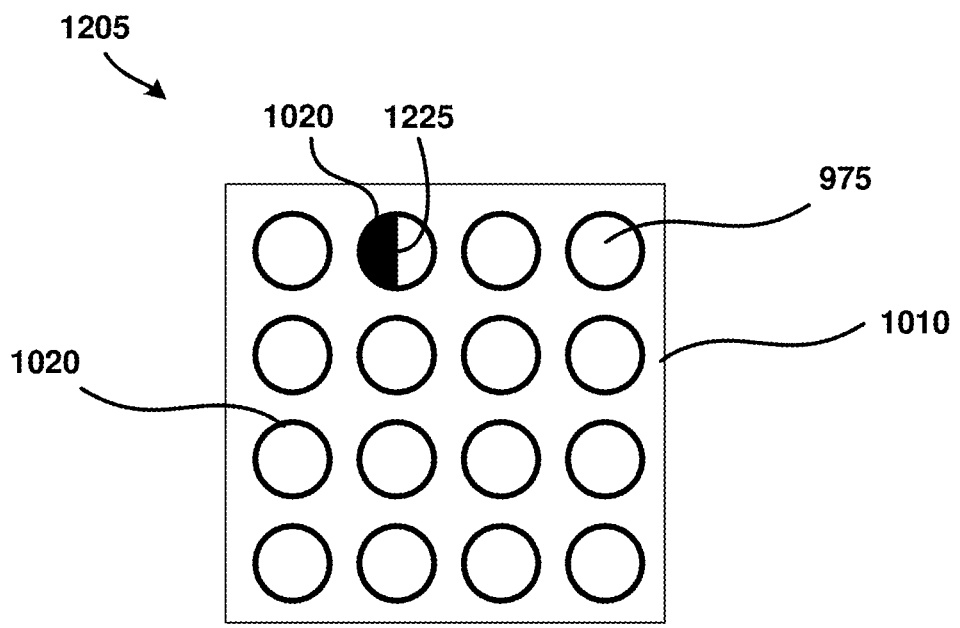

FIG. 12B illustrates a top view of another array 1205 of sixteen (16) VIAs 975 viewed from above the term pad 1010 that again includes the sixteen (16) apertures 1020. In accordance with various embodiments, the array 1205 in FIG. 12B includes one aperture 1020 containing a semi-circular fill 1225 of conductive material that does not completely fill the cross-sectional area of the VIA 975. The semi-circular fill 1225 maintains a hollow passage extending vertically that may promote convection, while also containing a portion of conductive material capable of conveying signals between layers. In the embodiment shown in FIG. 12B, the conductive material is formed on one lateral side of the VIA 975 to form a semi-circular cross-sectional shape. However, if the VIA 975 does not have a cylindrical shape, the conductive material may be formed into any shape that fills a portion of that differently shaped VIA. Also, although the semi-circular fill 1225 is illustrated as filling half of the VIA 975, alternatively the fill 1225 may fill less or more than half the cross-sectional area of the VIA 975.

Figure 12C:
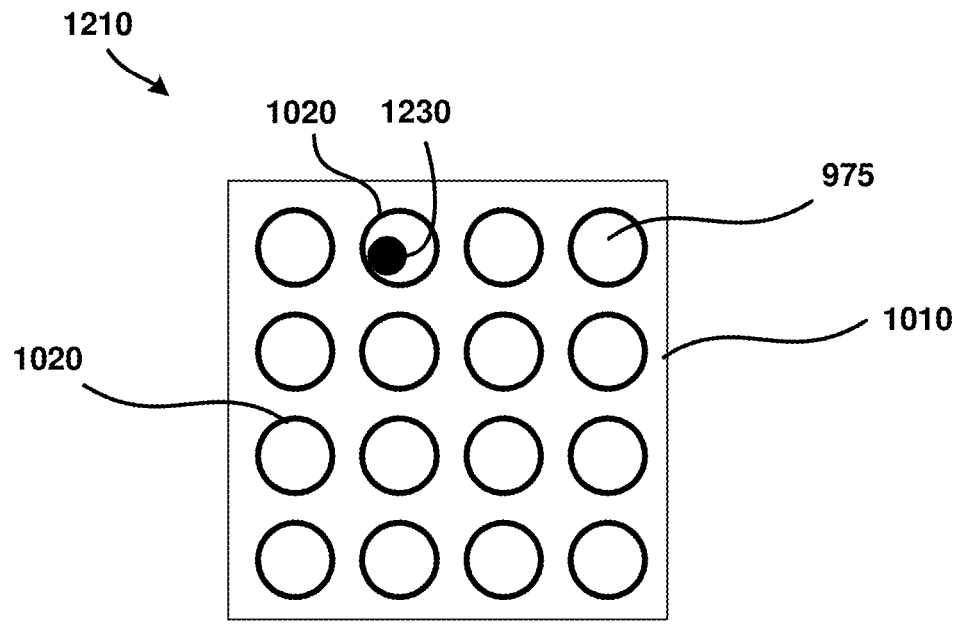

FIG. 12C illustrates a top view of another array 1210 of sixteen (16) VIAs 975 viewed from above the term pad 1010 that again includes the sixteen (16) apertures 1020. In accordance with various embodiments, the array 1210 in FIG. 12C includes one aperture 1020 containing a wire 1230 formed of conductive material that does not completely fill the cross-sectional area of the VIA 975. The wire 1230 maintains a hollow passage extending vertically alongside thereof that may promote convection, while also being formed of a conductive material capable of conveying signals between layers. In the embodiment shown in FIG. 12C, the wire 1230 has a circular cross-sectional shape. However, the wire 1230 may have almost any cross-sectional shape as needed for the application. The cross-sectional area the wire 1230 relative to the VIA 975 will determine how much empty space remains that may be used for heat transfer by convection. Thus, the wire 1230 may include a larger or smaller cross-sectional size relative to the VIA, as needed for the application.

Figure 12D:
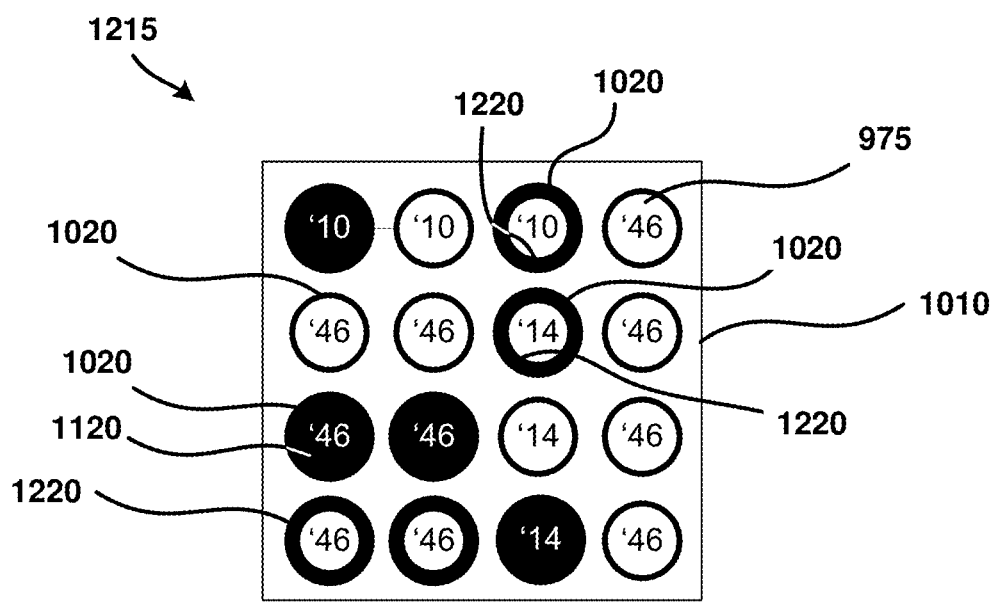

FIG. 12D illustrates a top view of another array 1215 of sixteen (16) VIAs 975 viewed from above the term pad 1010 that again includes the sixteen (16) apertures 1020. In accordance with various embodiments, the array 1215 in FIG. 12D includes a combination of VIA fill configurations. In this way, the VIAs 975 may be completely filled, partially filled, or not filled at all. In addition, the fill 1120 may block all or just a portion of a cross-sectional area of the VIA.

Alternatively, the VIA may have layers of conductive and non-conductive material in the VIA. The VIA may have a layer, or several layers of conductive material followed by a layer or several layers of non-conductive material followed by a layer or several layers of no material. The use of different material or lack of materials in a VIA can be a single fill type material or several fill type materials within the same VIA.

In FIG. 12D the number indicated in the apertures 1020 denotes the layer to which that aperture 1020 extends with the state of fill visible from the top of the array 1215. As described above with regard to FIGS. 10B and 11B, the numbers indicated in the apertures 1020 in FIG. 12D abbreviate the layer they extend to with the indicated state of fill by replacing the "9" with an apostrophe ("'"). Thus, the apertures 1020 indicated as "'46" and are completely filled-in represent VIAs in which all the layers are completely filled-in with fill 1120. The apertures 1020 indicated as "'46" and have an annular fill 1220 represent VIAs in which all the layers have both a hollow passage on conductive material extending alongside thereof. The apertures 1020 indicated as "'46" and have no fill represent VIAs in which none of the layers have fill, thus forming a hollow passage across all the layers.

In addition, other ones of the apertures 1020 indicated as "'10" may have varying states of fill extending from the top layer (e.g., 902) to the top-most inner signal layer (e.g., 910). Thus, the apertures 1020 indicated as "'10" and are completely filled-in represent VIAs in which the layers from the top layer (e.g., 902) to the top-most inner signal layer (e.g., 910) are completely filled-in (e.g., blocked) with fill 1120. The apertures 1020 indicated as "'10" and have an annular fill 1220 represent VIAs in which the layers from the top layer (e.g., 902) to the top-most inner signal layer (e.g., 910) have both a hollow passage on conductive material extending alongside thereof. The apertures 1020 indicated as "'10" and have no fill represent VIAs in which the layers from the top layer (e.g., 902) to the top-most inner signal layer (e.g., 910) have no fill, thus forming a hollow passage across those layers.

Similarly, other ones of the apertures 1020 indicated as "'14" may have varying states of fill extending from the top layer (e.g., 902) to the top-most inner signal layer (e.g., 910). Thus, the apertures 1020 indicated as "'14" and are completely filled-in represent VIAs in which the layers from the top layer (e.g., 902) to the second highest inner signal layer (e.g., 914) are completely filled-in (e.g., blocked) with fill 1120. The apertures 1020 indicated as "'14" and have an annular fill 1220 represent VIAs in which the layers from the top layer (e.g., 902) to the second highest inner signal layer (e.g., 914) have both a hollow passage on conductive material extending alongside thereof. The apertures 1020 indicated as "'14" and have no fill represent VIAs in which the layers from the top layer (e.g., 902) to the second highest inner signal layer (e.g., 914) have no fill, thus forming a hollow passage across those layers.

Figure 13A:
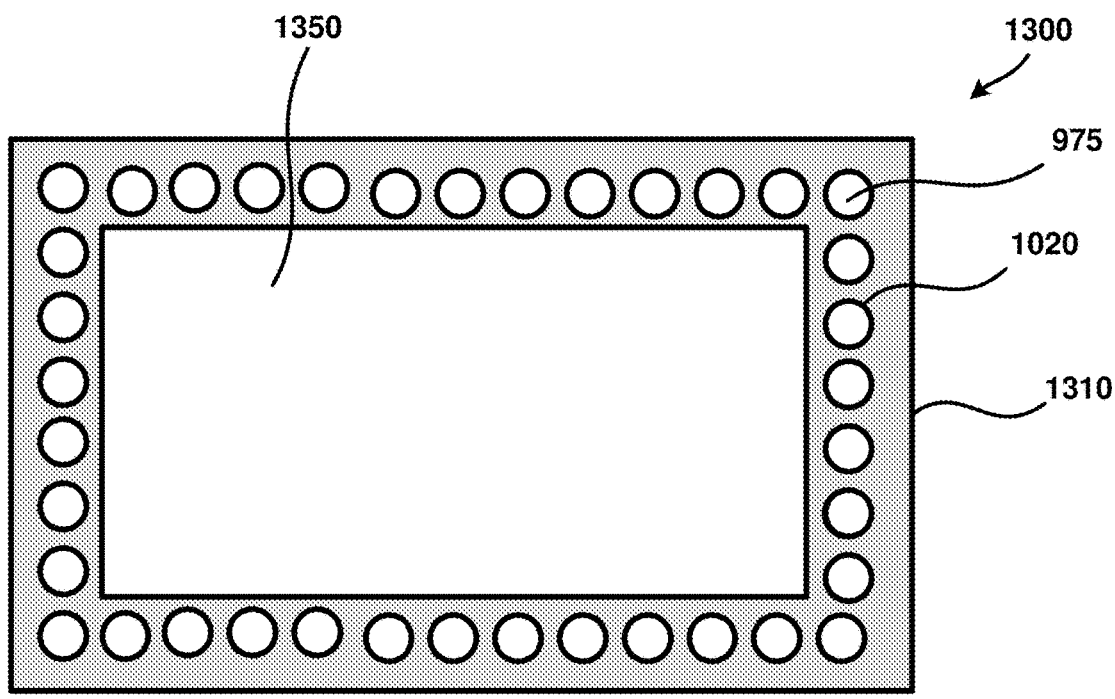
FIGS. 13A-13D are top views of perimeter arrays of VIAs visible through a term pad in accordance with some embodiments.

FIG. 13A illustrates a top view of another array 1300 of apertures 1020 and VIAs 975 viewed from above a perimeter term pad 1310 in accordance with various embodiments. The perimeter term pad 1310 includes a series of apertures 1020 arranged along an outer perimeter of the perimeter term pad 1310. The series of apertures 1020 are configured to align with a plurality of VIAs 975 that are spaced around a perimeter of an inner area of the plurality of layers (e.g., 902-946). The perimeter term pad 1310 may be formed of similar materials to those described above with regard to the term pads (e.g., 971, 973) of FIG. 9 or the term pad (e.g., 1010) of FIGS. 10A-12D. Similarly, the VIAs 975 may be vertically aligned around the perimeter with respective ones of the series of apertures 1020. The perimeter term pad 1310 may also include an inner open area 1350. The perimeter term pad 1310 may be as large as the PCB (e.g., 900) on which it is mounted, from a plan view, so that the VIAs are also distributed along a perimeter of the PCB. Alternatively, the perimeter term pad 1310 may be smaller than the PCB on which it is mounted.

Figure 13B:
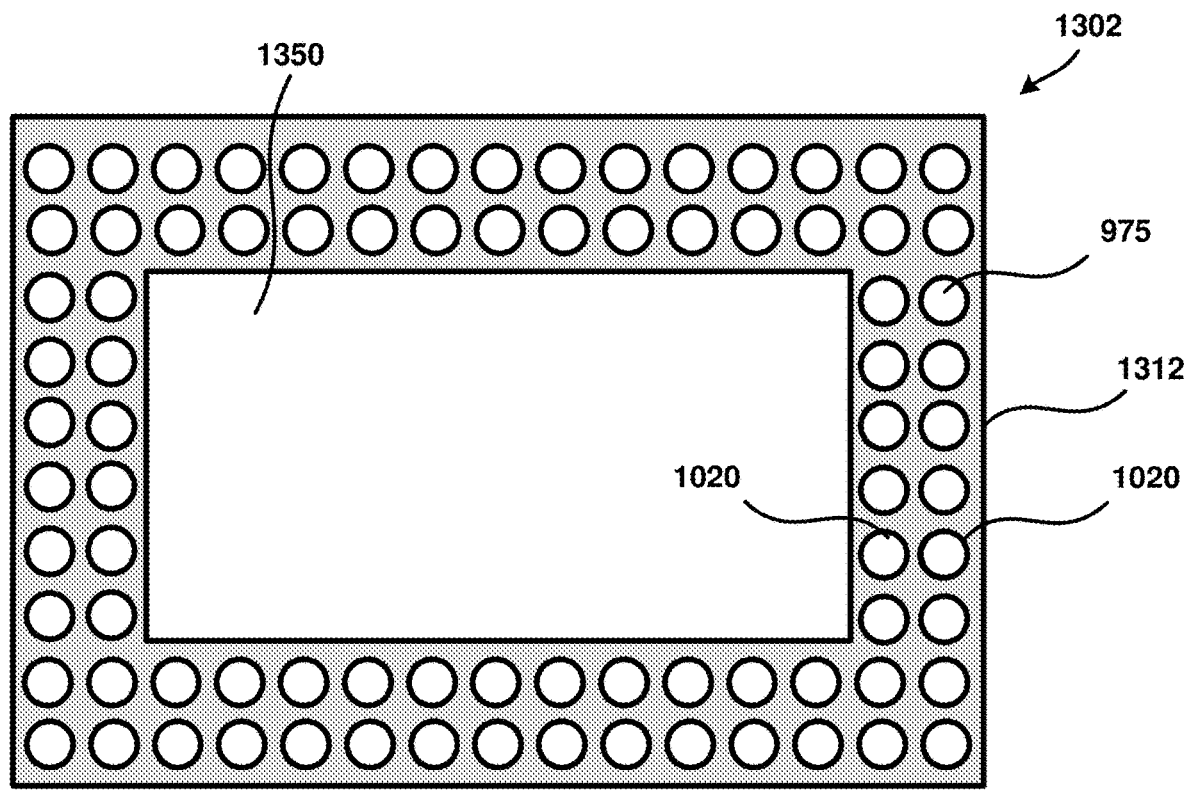

FIG. 13B illustrates a top view of another array 1302 of apertures 1020 and VIAs 975 viewed from above another perimeter term pad 1312 in accordance with various embodiments. The perimeter term pad 1312 includes two rows of apertures 1020 along an outer perimeter of the perimeter term pad 1312. The series of apertures 1020 are configured to align with a plurality of VIAs 975 that are spaced around a perimeter of an inner area of the plurality of layers (e.g., 902-946). Like the apertures 1020 of the perimeter term pad 1312, the plurality of VIAs 975 are arranged in two rows spaced around the perimeter of the inner area. An outer row of the plurality of VIAs is closer to the perimeter of the inner area than an inner row of the plurality of VIAs. The perimeter term pad 1312 may be formed of similar materials to those described above with regard to the term pads (e.g., 971, 973) of FIG. 9, the term pad (e.g., 1010) of FIGS. 10A-12D, and/or the perimeter term pad 1310 of FIG. 13A. Similarly, the VIAs 975 may be vertically aligned around the perimeter with respective ones of the two rows of apertures 1020. The perimeter term pad 1312 may also include an inner open area 1350. The perimeter term pad 1312 may be as large as the PCB (e.g., 900) on which it is mounted, from a plan view, so that the VIAs are also distributed along a perimeter of the PCB. Alternatively, the perimeter term pad 1312 may be smaller than the PCB on which it is mounted.

In FIGS. 13A and 13B, the apertures 1020 in the perimeter term pads 1310, 1312 and VIAs 975 are arranged in a single row and a double row, respectively, along the perimeter thereof. Alternatively, the perimeter term pads 1310, 1312 and VIAs 975 may be arranged in more than two rows, as needed for the desired application. Similarly, the size, number, and spacing of the apertures 1020 and VIAs 975 may be adjusted as needed for the desired application. As a further alternative, the apertures 1020 in the perimeter term pads 1310, 1312 and VIAs 975 may be distributed along only a portion of the perimeter of the perimeter term pads 1310, 1312, such as along one side, two sides, three sides, one half, or some other portion thereof.

Figure 13C:
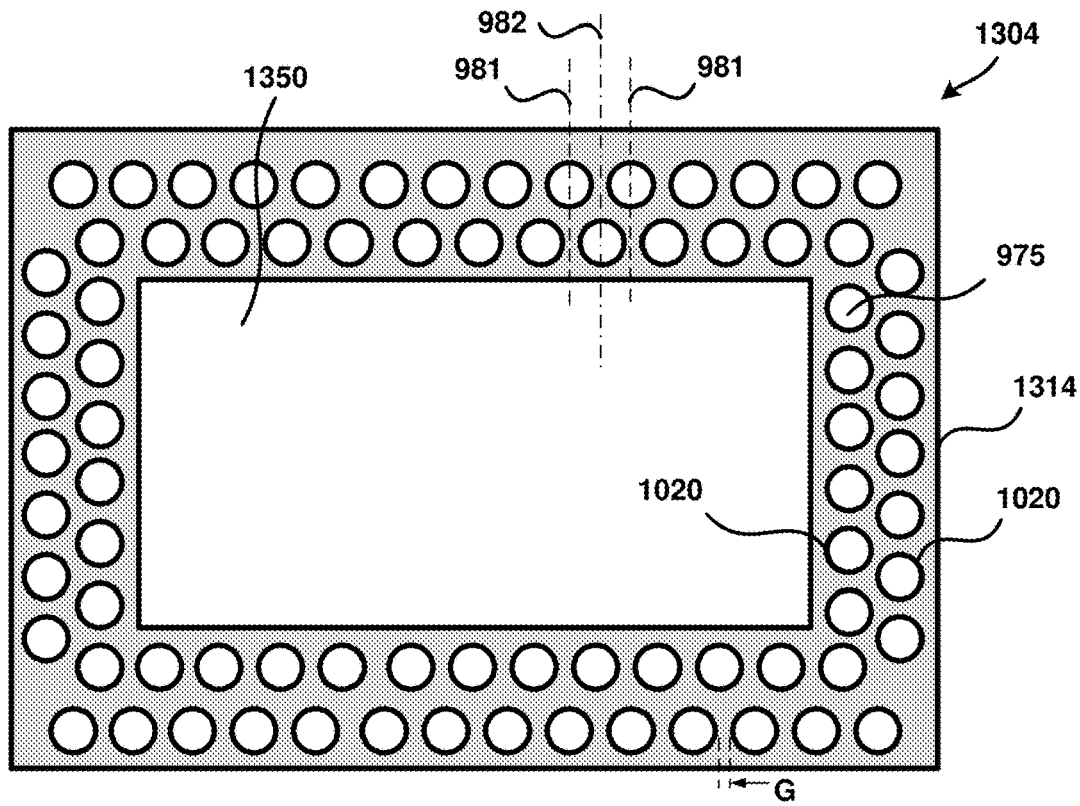

FIG. 13C illustrates a top view of an RF signal shielding array 1304 of apertures 1020 and VIAs 975 viewed from above another perimeter term pad 1314 in accordance with various embodiments. The apertures 1020 in the perimeter term pad 1314 are arranged so that a position of the apertures 1020 along one row is offset (either vertically or horizontally in the orientation shown in FIG. 13C) from the apertures 1020 in an adjacent row. In this way, center lines 981 extending orthogonal to the outer edges of the perimeter term pad 1314 for each of the apertures 1020 nearest to the outermost perimeter of the perimeter term pad 1314 are offset from similar center lines 982 of the apertures nearest to the inner open area 1350. The series of apertures 1020 in the perimeter term pad 1314 may be configured to align with a plurality of VIAs 975 that are spaced around a perimeter of an inner area of the plurality of layers (e.g., 902-946). In addition, as shown in FIG. 13C, a spacing of the outer row of the plurality of VIAs 975 may be offset from a spacing of the inner row of the plurality of VIAs. In this way, each of the plurality of VIAs in the inner row may be aligned between two adjacent ones of the plurality of VIAs in the outer row. The offset of the VIAs between rows that include conductive material may create a cancellation of radio energy that is configured to block and/or fill the gaps G between VIAs 975 to impede radio frequency (RF) interference laterally through the rows (i.e., across the columns of VIAs 975). Thus, the combination of at least two offset rows may provide an RF shielding that may protect components from emitting or receiving unwanted RF signals.

Figure 13D:
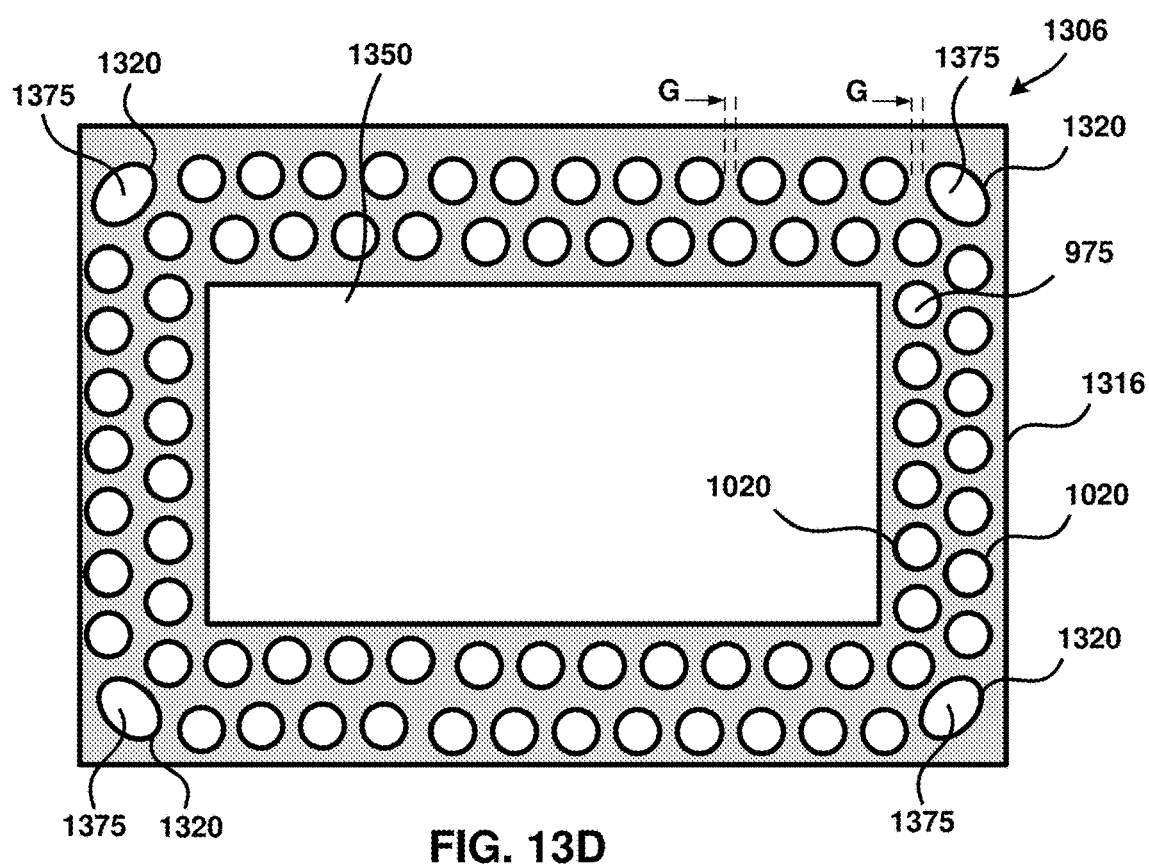

FIG. 13D illustrates a top view of another RF shielding array 1306 of apertures 1020 and VIAs 975 viewed from above another perimeter term pad 1316 in accordance with various embodiments. The apertures 1020 and VIAs 975 in the perimeter term pad 1316 are arranged similarly to those in the perimeter term pad 1314 of FIG. 13C, with the exception of the apertures 1020 and VIAs 975 closest to the corners, which for the perimeter term pad 1316 are replaced with elongate apertures 1320. The elongate apertures 1320, which may correspond to similarly shaped corner VIAs 1395, are configured to maintain a similar length gap G between the elongate apertures 1320 and the adjacent apertures 1020 thereto. The aperture 1320 can also be an un-plated VIA.

As a further alternative, the apertures 1020 and VIAs 975 in the perimeter term pads 1310, 1312, 1314, 1316 may be distributed along only a portion of the perimeter of the perimeter term pads 1312, such as along one side, two sides, three sides, one half, or some other portion thereof.

Figure 14A:
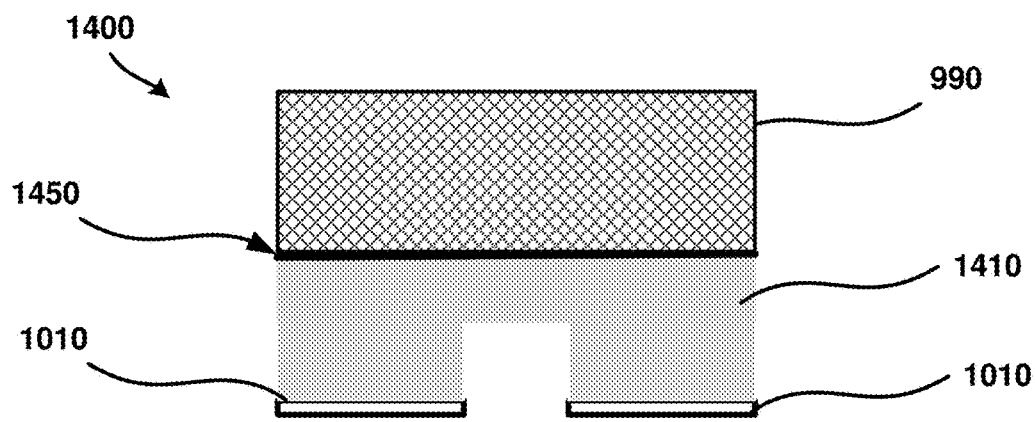
FIGS. 14A-14C are side elevation views of various forms of VIA bridge in accordance with some embodiments.

FIG. 14A illustrates a side elevation view of an enhanced PCB coupling 1400 using a VIA bridge 1410 in accordance with various embodiments. VIA bridges, such as the VIA bridge 1410, may be useful in various applications, such as when an external heat sink is added or needs to be attached to the PCB. The heat transfer between the external heat sink and the PCB may benefit from an enhanced means of thermal conductance, such as what may be provided by the VIA bridge 1410. The VIA bridge 1410 may provide thermal conductivity between one or more term pads 1010 and an external heat sink 990, as shown in FIG. 14A. In addition, a thermal interface material 1450 may be used for improving the thermal conductance between the VIA bridge 1410 and the heat sink 990 as well as providing electrical isolation.

The VIA bridge 1410 may be mechanically connected to one or more of the term pads 1010, such as by soldering. Alternatively, the VIA bridge 1410 may be connected to one or more of the term pads 1010 with a thermal interface material, as described above.

In accordance with various embodiments, the VIA bridge 1410 is a multi-leg bridge, particularly a double-leg bridge, since two separate portions of the VIA bridge 1410 connect to two separate term pads 1010. Multi-leg bridges may connect multiple separate term pads 1010 or even connect multiple separate apertures (e.g., 1020) in a single term pad 1010. In this way, term pads or apertures filled or partially filled with conductive materials may be connected to one another and the heat sink or other component. The VIA bridge 1410 may be configured and/or dimensioned so that the portion in contact with the heat sink 990 may provide the maximum surface contact to facilitate maximum heat transfer from the term pad 1010 to the heat sink 990.

The VIA bridge 1410 may be sized and/or dimensioned to facilitate insertion thereof onto a PCB using traditional component placement processes. The VIA bridge 1410, as well as the VIA bridges described above, may be made of a thermal conductive material, such as A6063 aluminum, copper, or the like.

The VIA bridge 1410 may be electrically fused to the term pad 1010, however the top of the VIA bridge 1410 may have a thermal interface material disposed between the VIA bridge 1410 and the heat sink 990 to provide thermal conductivity without electrical conductivity. In addition, the VIA bridge 1410 may couple select ones of the VIAs (e.g., 975) with their corresponding conductive material, enabling signal connectivity across VIAs.

Figure 14B:
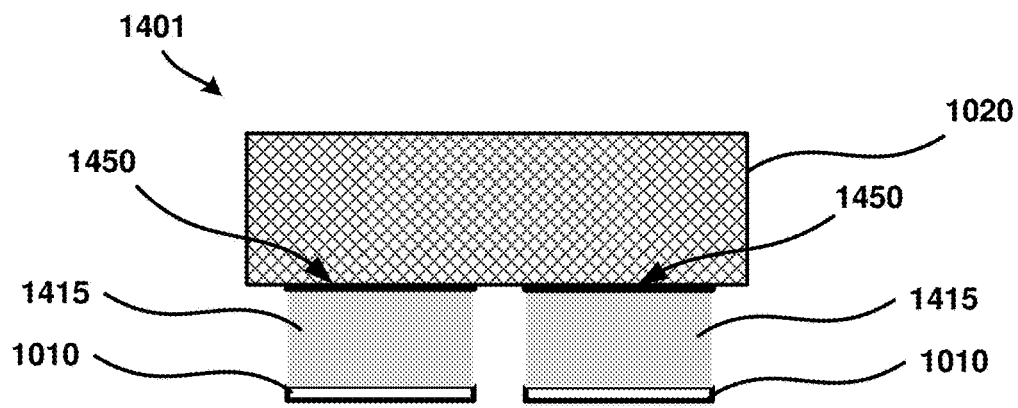

FIG. 14B illustrates a side elevation view of another enhanced PCB coupling 1401 using more than one single-leg VIA bridge 1415 in accordance with various embodiments. As shown, two single-leg VIA bridges 1415 may each separately interface with the same heat sink 990. Depending upon the size and configuration of PCB components, more than two VIA bridges (e.g., 1410, 1415) may be coupled to (i.e., interface with) the same heat sink 990. Additionally, a thermal interface material 1450 may be used for improving the thermal conductance between each of the VIA bridges 1410, 1415 and the heat sink 1020.

Figure 14C:
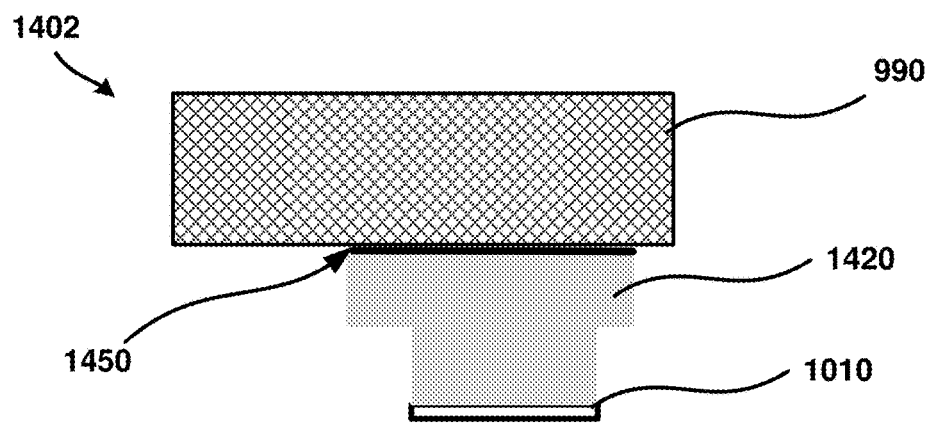

FIG. 14C illustrates a side elevation view of yet another enhanced PCB coupling 1402 using one single-leg VIA bridge 1420 with an enhanced heat sink surface area in accordance with various embodiments. As shown, wide-top single-leg VIA bridge 1420 may be interfaced with the heat sink 990. In accordance with various embodiments, a first surface area of the heat sink interface portion of the wide-top single-leg VIA bridge 1420 (i.e., the top in the orientation shown in FIG. 14C) may be larger than a second surface area of the term pad interface portion of the wide-top single-leg VIA bridge 1420 (i.e., the bottom in the orientation shown in FIG. 14C). Making the first surface area larger than the second surface area may enhance heat transfer to the heat sink 990. The larger surface area contact may improve thermal conductivity and thus improve heat transfer. Additionally, a thermal interface material 1450 may be used for improving the thermal conductance between the VIA bridge 1420 and the heat sink 990.

Figure 14D:
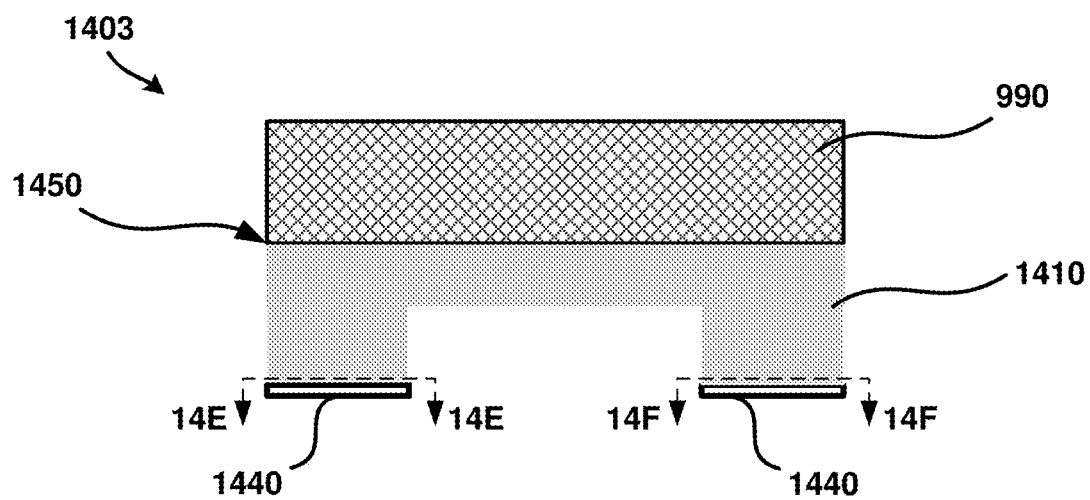
FIG. 14D is a side elevation view of an enhanced PCB coupling using a two-legged VIA bridge that conductively couples only select VIAs, in accordance with various embodiments.

FIG. 14D illustrates a side elevation view of yet another enhanced PCB coupling 1403 in accordance with various embodiments. The enhanced PCB coupling 1403 includes a two-legged VIA bridge 1410 configured to provide thermal heat transfer as well as signal transfer. The two-legged VIA bridge 1410 is coupled to two separate hybrid term pads 1440. The hybrid term pads 1440 may include portions with electrically conductive material and other portions with non-conductive material. Such hybrid term pads 1440 may be configured to provide an electrically conductive coupling between select VIAs 975 and the VIA bridge 1410. In accordance with various embodiments, the VIA bridge 1410 may be fastened to the hybrid term pads 1440, such as by soldering.

Figures 14E, 14F:
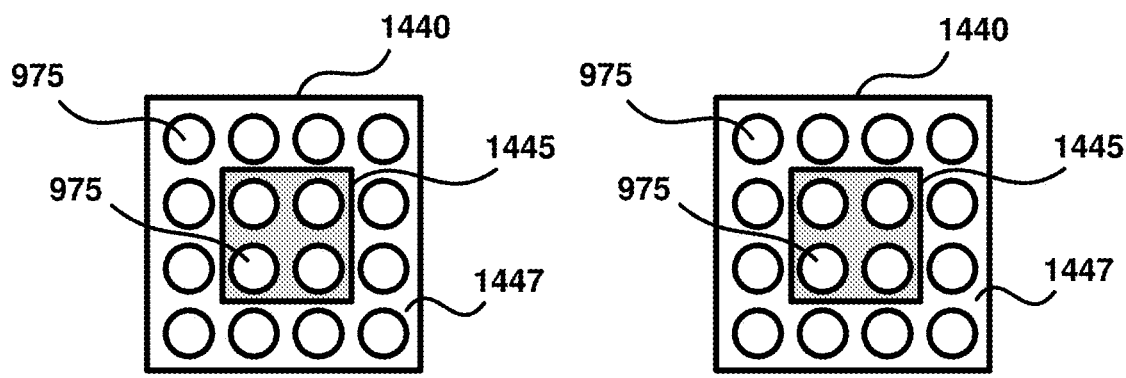
FIGS. 14E and 14F are top views of hybrid term pads at sections 14E-14E and 14F-14F, respectively, in FIG. 14D.

FIGS. 14E and 14F illustrate top views of the hybrid term pads 1440 at sections 14E-14E and 14F-14F, respectively, in FIG. 14D. In accordance with various embodiments, the hybrid term pads 1440 include a first section 1445 formed of electrically conductive material and a second section 1447 formed of non-conductive material. The first section 1445, which includes electrically conductive material, may enable power and/or signaling to be transferred to another part of the PCB or component thereof via the VIA bridge 1410. The second section 1447, which includes non-conductive material and/or thermally insulating material, may be configured to transfer heat from the corresponding VIAs 975 to the VIA bridge 1410. The non-conductive material and/or thermally insulating material may be added to the hybrid term pads 1440 or one or more sections thereof, such as in the form of a paste or paint that hardens or any suitable means. Alternatively, one or both of the first and second section 1445, 1447, may be configured to provide both electrical conductivity and heat transference (e.g., through convection).

Figure 14G:
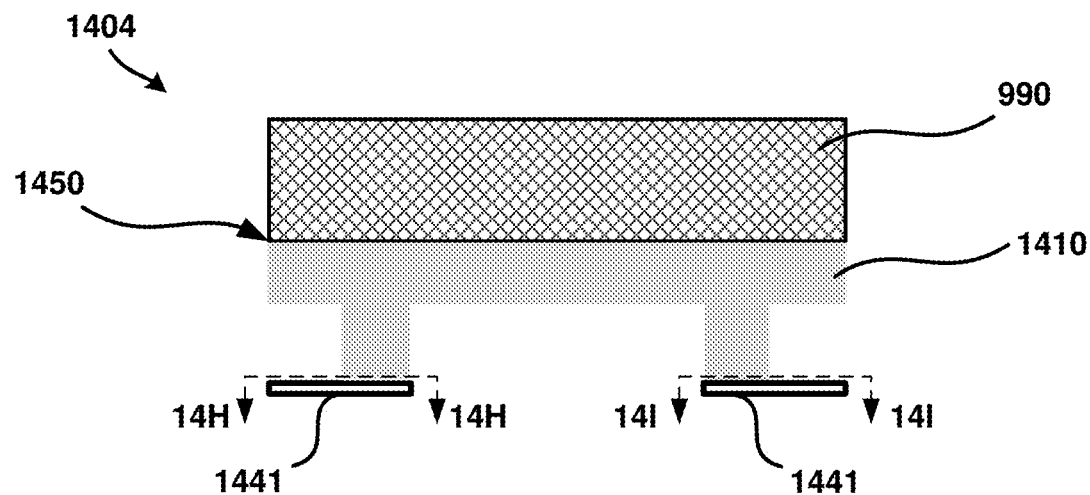
FIG. 14G is a side elevation view of an enhanced PCB coupling using a two-legged VIA bridge that conductively couples only select VIAs, in accordance with various embodiments.

FIG. 14G illustrates a side elevation view of yet another enhanced PCB coupling 1404 in accordance with various embodiments. The enhanced PCB coupling 1404 includes a two-legged VIA bridge 1410 that is coupled to two separate hybrid term pads 1441 but is configured to only engage a portion of the hybrid term pads 1441. The hybrid term pads 1441 may include portions with electrically conductive material and other portions with non-conductive material. However, only a portion of such hybrid term pads 1441 may be configured to couple to the VIA bridge 1410, such as to provide an electrically conductive coupling therebetween with select VIAs 975 and the VIA bridge 1410. In accordance with various embodiments, the VIA bridge 1410 may be fastened to the hybrid term pads 1441, such as by soldering.

Figures 14H, 14I:
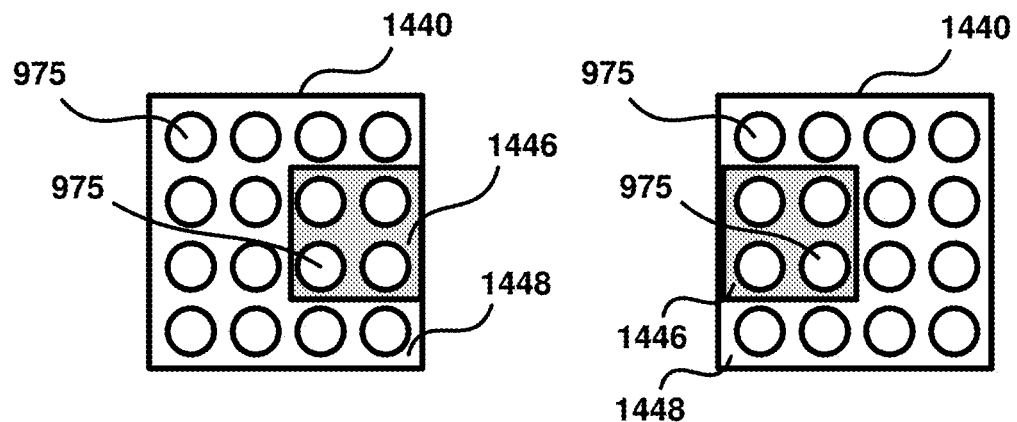
FIGS. 14H and 14I are top views of hybrid term pads at sections 14H-14H and 14I-14I, respectively, in FIG. 14G.

FIGS. 14H and 14I illustrate top views of the hybrid term pads 1440 at sections 14H-14H and 14I-14I, respectively, in FIG. 14G. In accordance with various embodiments, the hybrid term pads 1441 include a first section 1446 formed of electrically conductive material and a second section 1448 formed of non-conductive material. The first section 1446, which includes electrically conductive material, may be the only portion coupled to the VIA bridge 1410. In this way, the second section 1448, which includes non-conductive material and/or thermally insulating material, may be configured to transfer heat from the corresponding VIAs 975, but not to the VIA bridge 1410. Alternatively, section 1448 can also contain electrically conductive material however they are not connected to the VIA bridge 1410.

Unlike the sections of the hybrid term pad 1440 in FIGS. 14E and 14F, the hybrid the first section 1446 of the hybrid term pad 1441 need not be in the center. Alternatively, almost any portion of the hybrid term pad 1441 may include conductive material forming the first section 1446. In addition, the portion of conductive material forming the first section need not be contiguous on the hybrid term pad 1441.

Figure 14J:
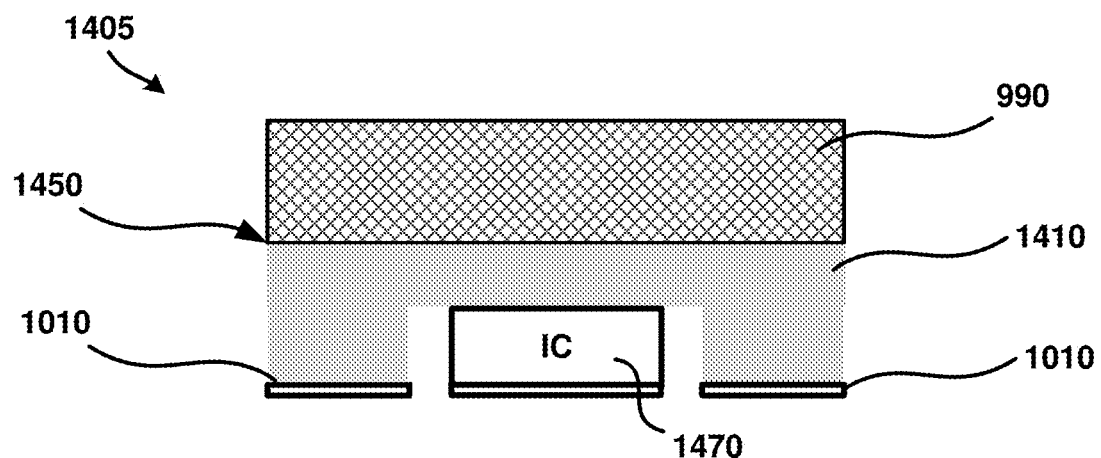
FIG. 14J is a side elevation view of an enhanced PCB coupling using a two-legged VIA bridge.

FIG. 14J illustrates a side elevation view of yet another enhanced PCB coupling 1405 in accordance with various embodiments. The enhanced PCB coupling 1405 includes a two-legged VIA bridge 1410 that is not only configured to couple two separate term pads 1010 but also connect to an integrated circuit (IC) 1470. FIG. 14J is similar to that of FIG. 14D with the exception that the IC 1470 is located under the VIA bridge 1410. The IC 1470 under the VIA bridge 1410 may use the VIA bridge 1410 for heat transfer. As with other embodiments, a thermal insulating material may be disposed between the IC 1470 and the VIA bridge 1410. Alternatively, the VIA bridge 1410 may be configured to deliver power and/or signaling to the IC 1470.

Figure 15A:
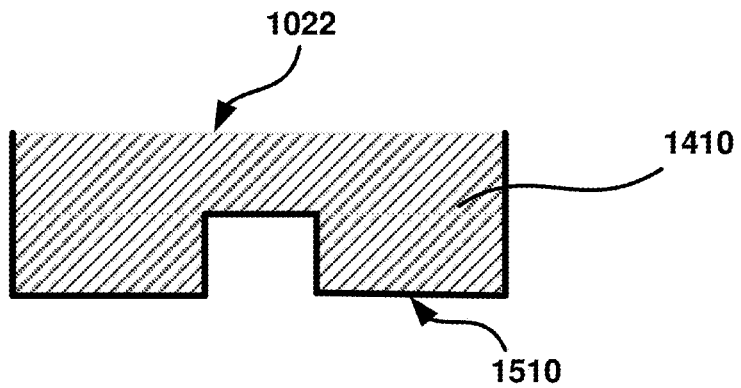
FIGS. 15A-15C are side elevation views of the VIA bridges in FIGS. 14A-14C in isolation in accordance with some embodiments.
Figure 15B:
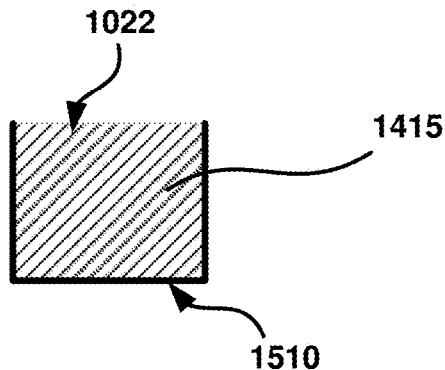
Figure 15C:
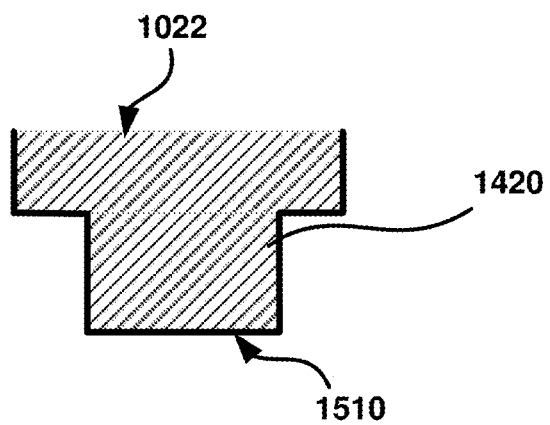

FIGS. 15A-15C illustrate side elevation views of various VIA bridges 1410, 1415, 1420 that include outer plating 1510. The plating used for VIA bridges 1410 may be tin or a similar material that bonds to the VIA bridge 1410 itself and provides for the ability to have soldering adhered thereto. The outer plating 1510 may be used on all surfaces except the upper surface 1022, which may be configured to receive thermal interface materials. Alternatively, the VIA bridge 1410 may be coupled to other components and/or layers from any surface thereof.

Figure 16:
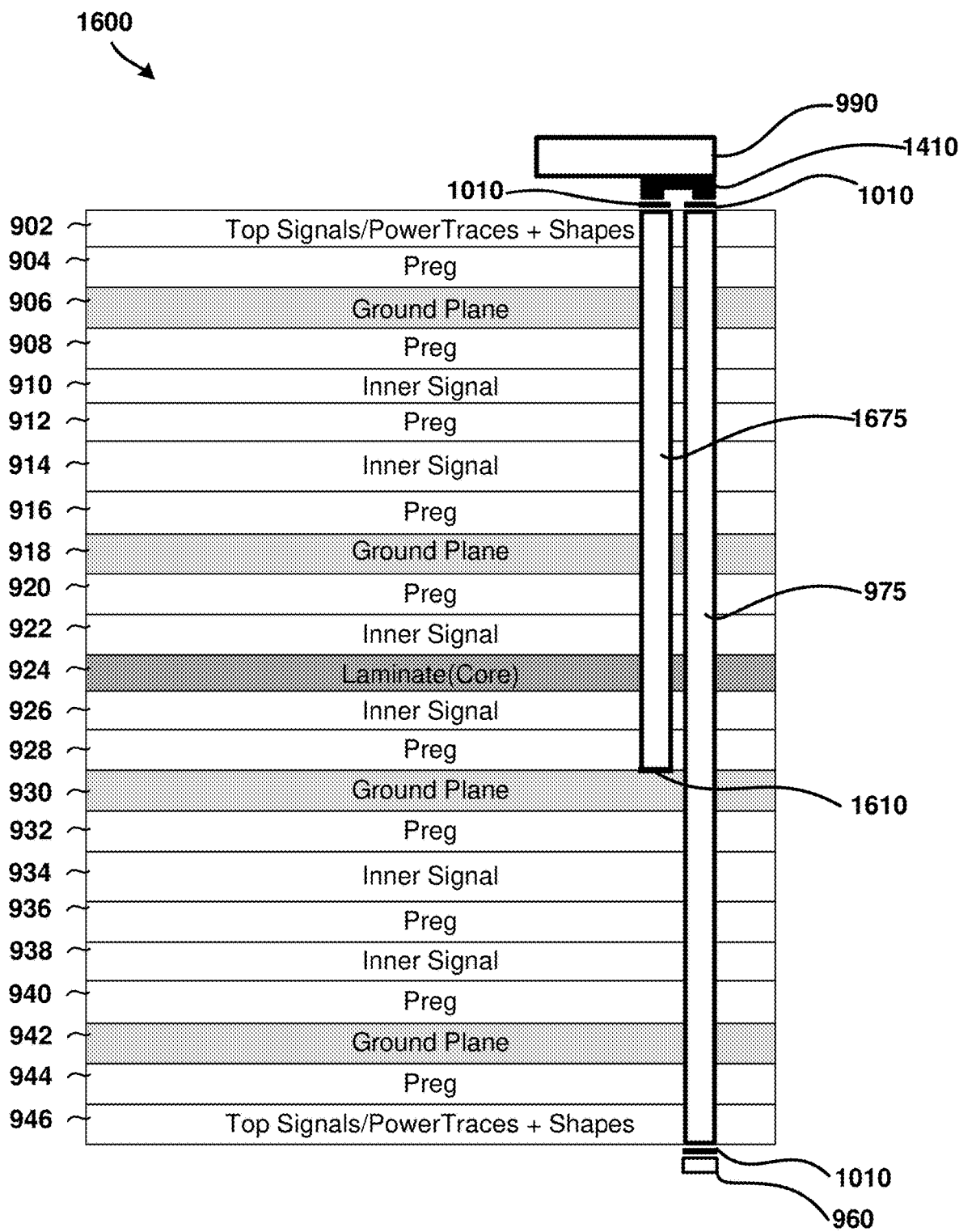
FIG. 16 is a cross-sectional side elevation view of a multilayer PCB that includes a multi-leg VIA bridge in accordance with some embodiments.

FIG. 16 illustrates a multilayer PCB 1600 that includes the multi-legged VIA bridge 1410 coupling two separate term pads 1010. The plurality of layers 902-946 of the multilayer PCB 1600 may be the same or similar to those described above with regard to the PCB (e.g., 900) described with regard to FIG. 9. Also, the multilayer PCB 1600 may include the same or similar IC 960 and heat sink 990 as described above. Additionally, the multilayer PCB 1600 may include the one or more VIAs 975, which may be referred to as a first set of passages, as well as another one or more VIAs 1675, which may be referred to as a second set of passages. The first set of passages 975 may extend through a different set of layers of the plurality of layers than the second set of passages 1675. In addition, the first set of passages 975 may be spaced away from the second set of passages 1675 more than the VIAs from the first set of passages 975 are spaced apart from one another. Similarly, the first and second sets of passages 975, 1675 may be spaced away from one another more than the VIAs from the second set of passages 1675 are spaced apart from one another.

Each of the sets of VIAs 975, 1675 may be formed by an array of aligned apertures through adjoining ones of the plurality of layers 902-946. For example, each of the sets of VIAs 975, 1675 may extend through at least one of the plurality of prepreg substrate layers (e.g., 904, 908, 912, 916, 920, 928, 932, 936, 940, 944), at least one of the plurality of ground plane layers (e.g., 906, 918, 930, 942), and at least one of the plurality of inner signal layers (e.g., 910, 914, 922, 926, 934, 938). In contrast to the first set of passages 975, the second set of passages 1675 may not extend through all the layers (e.g., 902-946) or at least not all the same layers as the first set of passages 975. As illustrated, the second set of passages 1675 extends from the top signal layer 902 through to the second lowest ground plane layer 930. Alternatively, the second set of passages 1675 could extend to a different layer as needed for the particular PCB board.

In addition to terminating at the second lowest ground plane layer 930, the second set of passages 1675 may include an additional mid-layer term pad 1610 at the lower end thereof. The additional mid-layer term pad 1610 may be similar to the other term pads described above (e.g., 971, 973, 1010), but is embedded between layers. In this way, both sets of passages 975, 1675 may have term pads 1010, 1010 at opposed ends thereof.

In accordance with various embodiments, the multi-legged VIA bridge 1410, in addition to coupling the two separate term pads 1010 may also couple the two sets of passages 975, 1675 to the same heat sink 990.

Figure 17:
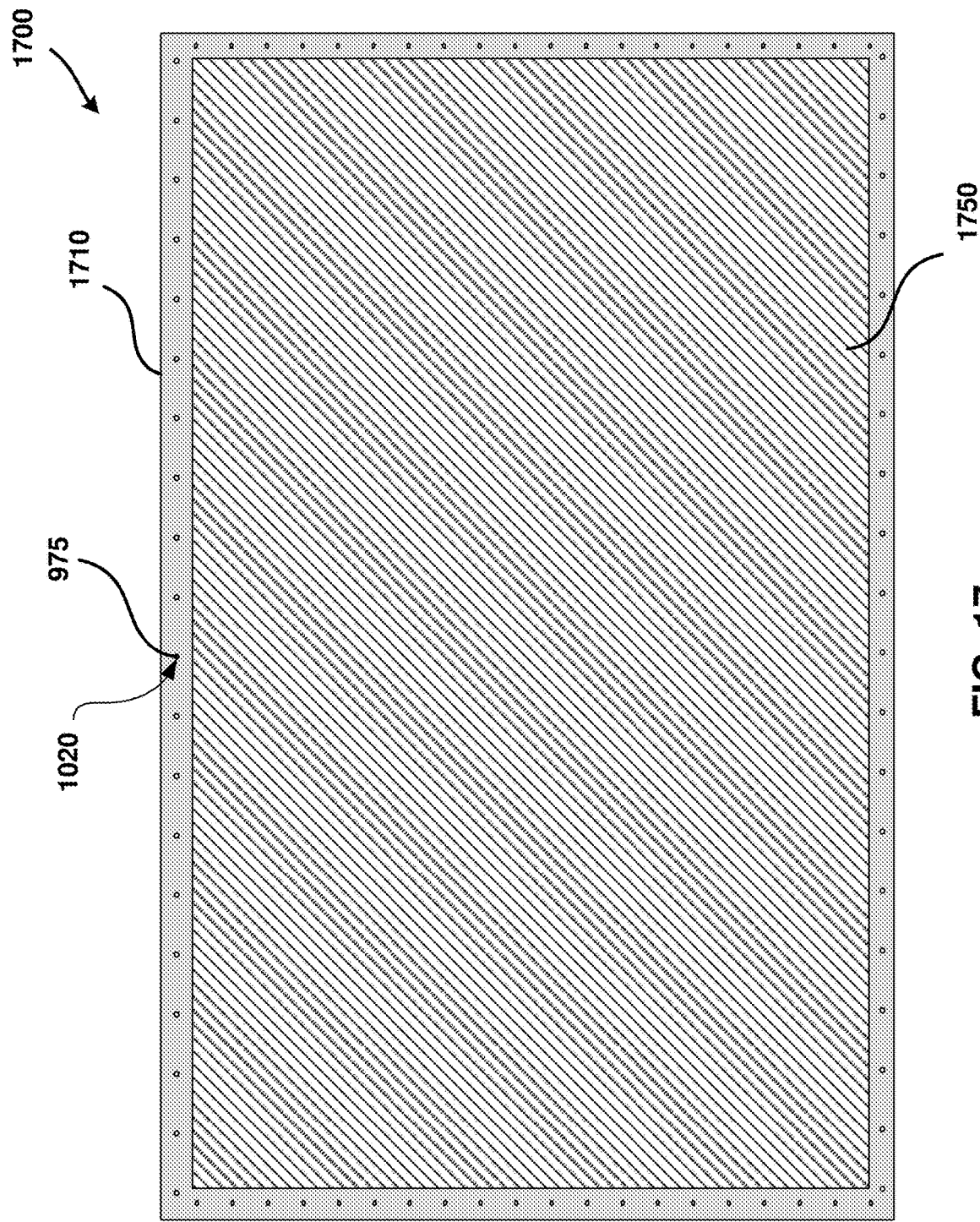
FIG. 17 is a top view of perimeter arrays of VIAs in accordance with various embodiments.

FIG. 17 illustrates a top view of another array 1700 of VIAs 975 viewed from above another perimeter term pad 1710 in accordance with various embodiments. The perimeter term pad 1710 includes a series of apertures 1020 along an outer perimeter of the perimeter term pad 1710. The perimeter term pad 1710 may be formed of similar materials to those described above with regard to the term pads (e.g., 971, 973) of FIG. 9, the term pad (e.g., 1010) of FIGS. 10A-12D, or the term pads (e.g., 1310, 1312) of FIGS. 13A and 13B. Similarly, the VIAs 975 may be vertically aligned around the perimeter with respective ones of the series of apertures 1020.

The foregoing method descriptions and the process flow diagrams are provided merely as illustrative examples and are not intended to require or imply that the blocks of the various embodiments must be performed in the order presented. As will be appreciated by one of skill in the art the order of blocks in the foregoing embodiments may be performed in any order. Words such as "thereafter," "then," "next," etc. are not intended to limit the order of the blocks; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm blocks described in connection with the embodiments disclosed herein may be implemented as electronic hardware, computer software, or combinations of both. To clearly illustrate this interchangeability of hardware and software, various illustrative components, blocks, modules, circuits, and blocks have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The hardware used to implement the various illustrative logics, logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some blocks or methods may be performed by circuitry that is specific to a given function.

In one or more exemplary aspects, the functions described may be implemented in hardware, software, firmware, or any combination thereof. If implemented in software, the functions may be stored as one or more instructions or code on a non-transitory computer-readable medium or non-transitory processor-readable medium. The steps of a method or algorithm disclosed herein may be embodied in a processor-executable software module which may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable media may include RAM, ROM, EEPROM, FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable medium and/or computer-readable medium, which may be incorporated into a computer program product.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein.

What is claimed is:

1. A multi-layer printed circuit board (PCB), comprising:
a plurality of layers including:
   a pair of signal layers,
   a plurality of prepreg substrate layers disposed between the pair of signal layers,
   a plurality of ground plane layers, wherein each of the plurality of ground plane layers abuts one of the plurality of prepreg substrate layers,
   a plurality of inner signal layers, wherein each of the plurality of the inner signal layers abuts one of the plurality of prepreg substrate layers, and
   a core substrate layer disposed between the pair of signal layers, wherein two of the plurality of inner signal layers abut opposed sides of the core substrate layer;
one or more vertical interconnect accesses (VIAs) extending through at least some of the plurality of layers, wherein each of the one or more VIAs is formed by aligned apertures through adjoining ones of at least one of the plurality of prepreg substrate layers, at least one of the plurality of ground plane layers, and at least one of the plurality of inner signal layers; and
a vertical interconnect access (VIA) bridge formed of conductive material and coupled to at least one of the one or more VIAs to convey heat from the at least one of the one or more VIAs to a heat sink.

2. The multi-layer PCB of claim 1, wherein at least one of the one or more VIAs is a convection passage, wherein each convection passage is configured to promote heat transfer via convection through at least some of the plurality of layers.

3. The multi-layer PCB of claim 2, wherein at least one of the one or more VIAs is a conductive passage, wherein each conductive passage contains an electrically conductive material therein extending through at least some of the plurality of layers.

4. The multi-layer PCB of claim 3, wherein the electrically conductive material, in at least one of the one or more VIAs, includes a hollow passage extending vertically within the electrically conductive material and configured to promote heat transfer via convection through the hollow passage of the electrically conductive material.

5. The multi-layer PCB of claim 3, wherein the electrically conductive material, in at least one of the one or more VIAs, fills at least one of the aligned apertures.

6. The multi-layer PCB of claim 3, wherein the electrically conductive material, in at least one of the one or more VIAs, fills only a partial vertical extent of the at least one of the one or more VIAs.

7. The multi-layer PCB of claim 1, wherein the one or more VIAs include a plurality of VIAs spaced around a perimeter of an inner area of the plurality of layers.

8. The multi-layer PCB of claim 7, wherein the plurality of VIAs are arranged in two rows spaced around the perimeter of the inner area, wherein an outer row of the plurality of VIAs is closer to the perimeter of the inner area than an inner row of the plurality of VIAs.

9. The multi-layer PCB of claim 8, wherein a spacing of the outer row of the plurality of VIAs is offset from a spacing of the inner row of the plurality of VIAs, such that each of the plurality of VIAs in the inner row is aligned between two adjacent ones of the plurality of VIAs in the outer row.

10. The multi-layer PCB of claim 1, further comprising: two or more term pads disposed at opposed vertical ends of the one or more VIAs.

11. The multi-layer PCB of claim 10, wherein the VIA bridge couples the two or more term pads and is configured to convey heat from the two or more term pads to the same heat sink.

12. The multi-layer PCB of claim 11, wherein each of the two or more term pads is associated with a separate set of the one or more VIAs.

13. The multi-layer PCB of claim 10, wherein the VIA bridge couples to only a portion of an outer surface of at least one of the two or more term pads.

14. The multi-layer PCB of claim 10, wherein at least one of the two or more term pads includes a first section with the conductive material and a second section with non-conductive material.

15. The multi-layer PCB of claim 10, wherein a first surface of the VIA bridge coupled to the heat sink includes a larger surface area than a second surface of the VIA bridge coupled to the two or more term pads.

16. The multi-layer PCB of claim 1, wherein the VIA bridge includes a clad plating on surfaces other than a surface coupling the VIA bridge to the heat sink.

17. The multi-layer PCB of claim 1, wherein the VIA bridge couples at least one of the one or more VIAs to an integrated circuit.

18. The multi-layer PCB of claim 1, wherein the one or more VIAs includes a first set of passages and a second set of passages, wherein the first set of passages extends through a different set of layers of the plurality of layers than the second set of passages.

19. The multi-layer PCB of claim 1, wherein the one or more VIAs includes a first set of passages and a second set of passages, wherein the first set of passages are spaced away from the second set of passages more than the first set of passages are spaced apart from one another.

20. A computing device, comprising:
a multi-layer printed circuit board (PCB) comprising:
a plurality of layers including:
a pair of signal layers,
a plurality of prepreg substrate layers disposed between the pair of signal layers,
a plurality of ground plane layers, wherein each of the plurality of ground plane layers abuts one of the plurality of prepreg substrate layers,
a plurality of inner signal layers, wherein each of the plurality of the inner signal layers abuts one of the plurality of prepreg substrate layers, and
a core substrate layer disposed between the pair of signal layers, wherein two of the plurality of inner signal layers abut opposed sides of the core substrate layer;
one or more vertical interconnect accesses (VIAs) extending through at least some of the plurality of layers, wherein each of the one or more VIAs is formed by aligned apertures through adjoining ones of at least one of the plurality of prepreg substrate layers, at least one of the plurality of ground plane layers, and at least one of the plurality of inner signal layers; and
a vertical interconnect access (VIA) bridge formed of conductive material and coupled to at least one of the one or more VIAs to convey heat from the at least one of the one or more VIAs to a heat sink.

* * * * *